United States Patent
Yeager et al.

(10) Patent No.: US 10,275,545 B2
(45) Date of Patent: Apr. 30, 2019

(54) MODELING AND SIMULATION

(71) Applicant: Ventana Systems, Inc., Harvard, MA (US)

(72) Inventors: Larry F. Yeager, Bolton, MA (US); Thomas S. Fiddaman, Bozeman, MT (US); David W. Peterson, Harvard, MA (US); Alan Karl Graham, Lexington, MA (US)

(73) Assignee: Ventana Systems, Inc., Harvard, MA (US)

( * ) Notice: Subject to any disclaimer, the term of this patent is extended or adjusted under 35 U.S.C. 154(b) by 0 days.

(21) Appl. No.: 13/837,732

(22) Filed: Mar. 15, 2013

(65) Prior Publication Data

US 2014/0278294 A1  Sep. 18, 2014

(51) Int. Cl.
*G06F 17/50* (2006.01)

(52) U.S. Cl.
CPC ............... *G06F 17/5009* (2013.01)

(58) Field of Classification Search
None
See application file for complete search history.

(56) References Cited

U.S. PATENT DOCUMENTS

| | | | | |
|---|---|---|---|---|
| 5,428,740 A * | 6/1995 | Wood et al. | | 345/440 |
| 5,446,652 A * | 8/1995 | Peterson et al. | | 703/6 |
| 7,930,159 B1 * | 4/2011 | Florissi | | G06F 17/5009 703/13 |
| 8,744,840 B1 * | 6/2014 | Morrison | | G06F 17/2827 704/1 |
| 2002/0138242 A1 * | 9/2002 | Wilensky | | G06F 17/5009 703/13 |
| 2002/0170042 A1 * | 11/2002 | Do | | G06F 8/20 717/143 |
| 2005/0131667 A1 * | 6/2005 | Woodring | | G06F 17/5009 703/22 |
| 2007/0192081 A1 * | 8/2007 | Konno | | G06F 17/5009 703/22 |
| 2010/0217650 A1 | 8/2010 | Hartnell | | |
| 2012/0290464 A1 | 11/2012 | Borkovec et al. | | |
| 2012/0331061 A1 | 12/2012 | Lininger | | |

(Continued)

FOREIGN PATENT DOCUMENTS

WO    WO 01/01206    1/2001

OTHER PUBLICATIONS

N. Helfrich and W. Schade, "Bringing distributed software development to SD modelling with vensim," in Proceedings of the 26th International Conference of the System Dynamics Society, Athens, Greece, Jul. 2008.*

(Continued)

*Primary Examiner* — Omar F Fernandez Rivas
*Assistant Examiner* — Robert S Brock
(74) *Attorney, Agent, or Firm* — Fish & Richardson P.C.

(57) ABSTRACT

A method includes, based on information received from a user through a graphical user interface, forming and storing elements that define a model that can be run by a computer to simulate operation of a real-world system that includes real-world features. The method includes including in the elements that are formed and stored, collections of software entities that correspond to the real-world features, and running the model using the software entities.

77 Claims, 23 Drawing Sheets

(56) References Cited

U.S. PATENT DOCUMENTS

| | | | |
|---|---|---|---|
| 2014/0012856 A1* | 1/2014 | Abdelrahman | G06Q 30/0621 707/740 |
| 2014/0279747 A1* | 9/2014 | Strassner | G06N 99/005 706/12 |
| 2014/0343916 A1* | 11/2014 | Rai | G06F 17/5009 703/13 |
| 2015/0220311 A1* | 8/2015 | Salter | G06F 8/34 717/105 |
| 2016/0261466 A1* | 9/2016 | Daniel | G06F 8/10 |

OTHER PUBLICATIONS

Daphne Koller and Avi Pfeffer. Object-oriented bayesian networks. Proceedings of the Thirteenth Annual Conference on Uncertainty in Artificial Intelligence (UAI-97), Providence, Rhode Island, USA, pp. 302-313, 1997.*

Nir Friedman, Lise Getoor, Daphne Koller, and Avi Pfeffer. Learning probabilistic relational models. Proceedings of the Sixteenth International Joint Conference on Artificial Intelligence, 1999.*

Authors Unkown, Vensim User's Guide Version 5, Ventana Systems, Inc, retrieved on Feb. 21, 2014 from http://web.archive.org/web/20110110172124/http://vensim.com/ffiles/VensimUsersGuide.zip for archive date Jan. 10, 2011.*

Authors Unkown, Vensim Reference Manual, Ventana Systems, Inc, retrieved on Feb. 21, 2014 from http://web.archive.org/web/20110110172333/http://vensim.com/ffiles/VensimReferenceManual.zip for archive date Jan. 10, 2011.*

Authors Unkown, Vensim Modeling Guide, Ventana Systems, Inc, retrieved on Feb. 21, 2014 from http://web.archive.org/web/20110110172709/http://vensim.com/ffiles/VensimModelingGuide.zip for archive date Jan. 10, 2011.*

Authors Unknown, Modeling with Molecules 2.02, Ventana Systems, Inc, retrieved on Feb. 21, 2014 from http://web.archive.org/web/20120305103546/http://www.vensim.com/molecule.html for archive date Mar. 5, 2012.*

Nathaniel Osgood. Using Traditional and Agent Based Toolsets for System Dynamics : Present Tradeoffs and Future Evolution. System Dynamics, 2007.*

Christian Bauer, Freimut Bodendorf, Component-Based Composition of System Dynamics Models, Proceedings 19th European Conference on Modelling and Simulation, Yuri Merkuryev, Richard Zobel, Eugene Kerckhoffs (2005), 8 pages.*

W. Tignor (2004) System Engineering and System Dynamics Models. The 22nd International Conference of the System Dynamics Society, 32 pages.*

Tignor, W. 2003. Stock and Flow, and Unified Modeling Language Relationships. Proceedings of 21th International Conference of the System Dynamics Society. 10 pages.*

Arief, L. B. (2001). A Framework for Supporting Automatic Simulation Generation from Design. Ph.D. dissertation, University of Newcastle Upon Tyne, 164 pages.*

Barros, M. O., Cláudia Maria Lima Werner, and Guilherme Horta Travassos. "From metamodels to models: Organizing and reusing domain knowledge in system dynamics model development." In Proceedings of the 19 th International Conference of the System Dynamics Society, Atlanta Jul. 2001. 16 pages.*

Cubert, Robert M., and Paul A. Fishwick. "A framework for distributed object-oriented multimodeling and simulation." In Proceedings of the 29th conference on Winter simulation, pp. 1315-1322. IEEE Computer Society, 1997.*

Elsawah, Sondoss, Alan Mclucas, and Mike Ryan. "Generic and reusable structure in systems dynamics modelling: roadmap of literature and future research questions." Tentative Schedule of the 33rd System Dynamics Society (2015). 15 pages.*

Myrtveit, Magne. "Object-oriented extensions to system dynamics." In Proc. 18th Int'l System Dynamics Conference. 2000. 65 pages.*

Powers, Robert. "An Object-oriented approach to managing model complexity." Masters thesis, The University of Bergen, 2011. 88 pages.*

International Search Report and Written Opinion for App. Ser. No. PCT/US14/25770, dated Aug. 21, 2014, 20 pages.

Climate Interactive, "World Climate: A Computer-Simulation-Based Role-Playing Exercise" (2013) [online], [retrieved on Mar. 11, 2013]. Retrieved from the Internet: http://climateinteractive.org/simulations/world-climate, 2 pages.

Eubanks and Yeager, "An Introduction to Jitia: Simulation Software Designed for Developing Large System Models," 15 pages (2001).

Google Project Hosting, "uofs-silver—SILVER: Software in Support of Simulation Modeling" [online], [retrieved on Mar. 14, 2013]. Retrieved from the Internet: http://code.google.com/p/ufs-silver, 1 page.

Helfrich and Schade, "Bringing distributed software development to SD modeling with Vensim," *System Dynamics Society* (Mar. 21, 2008), 12 pages.

Osgood, "SILVER: Software in Support of the System Dynamics Modeling Process," Conference Proceedings, the 27$^{th}$ International Conference of the System Dynamics Society, Albuquerque, New Mexico, 12 pages (Jul. 26-30, 2009).

Thompson and Bush, "Group Development Software for Vensim®," Proceedings of the 23$^{rd}$ International Conference of the System and Dynamics Society, Boston, Massachusetts, 12 pages (Jul. 17-21, 2005).

Muetzelfeldt et al., "The Simile visual modelling environment," *Europ. J Agronomy*, 18:345-358 (2003).

System Dynamics Discussion Forum, Ventity and Simile by Robert Muetzelfeldt, Nov. 18, 2014 [online]. Retrieved from the Internet on Apr. 22, 2015 at: http://www.systemdynamics.org/forum/viewtopic.pho?f=4&t=433#p2409, 6 pages.

International Preliminary Report on Patentability for App. Ser. No. PCT/US14/25770, dated Sep. 15, 2015, 9 pages.

* cited by examiner

FIG. 12

MODELING AND SIMULATION

BACKGROUND

System dynamics computer simulation has long been used to study system behavior. The aim is to improve real world systems through understanding and subsequently improved decision making and policy setting. Other approaches to modeling and simulation, such as discrete event simulation, agent-based modeling, and modeling using spreadsheets, have also been used to study system behavior.

SUMMARY

In a general aspect, a method includes, based on information received from a user through a graphical user interface, forming and storing elements that define a model that can be run by a computer to simulate operation of a real-world system that includes real-world features. The method includes including in the elements that are formed and stored, collections of software entities that correspond to the real-world features, and running the model using the software entities.

Embodiments may include one or more of the following.

Running the model includes running the model in a mode that combines continuous-time simulation and discrete event simulation. In some cases, the mode of running the model also includes the use of software agents.

The model is expressed in a declarative, non-procedural language.

The method includes changing the software entities dynamically during the running of the model.

At least some of the entities that form the model can be copied and reused in defining other models.

The model includes entities that serve as relationship lists.

At least some of the entities include equations that represent stocks and flows. In some cases, at least some of the stocks, at least some of the flows, or both, include respective qualities. In some cases, each quality is represented by an equation determined from the equation that represents the corresponding stock or the corresponding flow. In some cases, at least one of the entities includes a plurality of alternative equations for the entity. In some cases, the alternative equations for a particular entity are conditional upon attributes of the entity.

At least some of the collections of entities represent multidimensional data without using arrays.

The elements of the model are stored based on information received from multiple cooperating users who are working essentially simultaneously on a given aspect of the model or are working essentially simultaneously on different aspects of the model, or both.

The elements of the model include equations. In some cases, the equations are generated automatically from graphical representations that are manipulated by the users through the graphical user interface. In some cases, the equations include variables, and in which the method includes checking the variables of the equations for dimensional consistency.

The information received from the user is other than programming code.

The method includes exposing to the user a graphical user interface to enable the user to interactively and graphically cause the elements of the model to be formed and stored.

The method includes running a portion of the model using only a portion of the software entities.

The running of the model occurs quickly enough that the user can interact with the elements of the model while the model is running, and the running of the model changes to reflect the user's interaction.

The method includes exposing a data interface through which data to be used by the model and data generated by the model can be passed back and forth to systems that maintain data according to common protocols.

The method includes processing data received from a data source. In some cases, processing data includes adjusting a temporal property of the data, interpolating the data, extrapolating the data, converting units associated with the data, aggregating the data, allocating the data into categories, or a combination of any two or more of them.

The elements of the model include entity type definitions from which instances of entities can be instantiated. In some cases, entities instantiated from a given entity type definition are grouped into a collection for common processing. In some cases, entities sharing one or more common attributes are automatically grouped into a collection. In some cases, entities sharing one or more common attributes and one or more common variables are automatically grouped into a collection. In some cases, entities from multiple entity types that are based on a common parent entity type are automatically grouped into a super-collection.

In some cases, the method includes exposing through the user interface graphical representations of the entity type definitions and relationships among them. In some cases, the method includes enabling the user to interact with the representations and adjusting the model in accordance with the user's interactions.

In some cases, running of the model includes creating and eliminating instantiations of entities. In some cases, each of the entity type definitions comprises properties that model a state of the entities that are instantiated from the definition. In some cases, each of the entity type definitions comprises rules and equations that determine a change in the state of the entities that are instantiated from the definition during the running of the model. In some cases, entity type definitions are defined based on other entity type definitions.

In some cases, the entity type definitions are defined by the user through the graphical user interface. In some cases, two or more users collaborate essentially simultaneously in defining the entity type definitions. In some cases, the graphical user interface provides a diagrammatic interface including a toolbar and a workspace.

Some of the entities comprise relationship entities that define relationships among other entities.

Relationship entities include internal states of entities and dynamic behavior of entities.

The model elements include action components that provide discrete event and agent-based capabilities in the context of a continuous dynamic model. In some cases, one or more of the action components include schedule properties indicative of when the action component is to be executed. In some cases, one or more of the action components include condition properties indicative of a condition upon which the action is to be executed. In some cases, one or more of the action components cause changes of state of a plurality of entities to occur at substantially the same time.

At least some of the entities are created during the initialization or running of the model, and the creation of entities is governed by probabilistic functions based on statistical distributions. In some cases, the statistical distributions are derived from behavior of existing entities during the running of the model.

The model is organized in modules. In some cases, the modules are to be maintained by different users.

The method includes defining the model entities without requiring them to include information or structure that is specific to a problem, system, or situation, and initializing the model using data from external sources.

Each of the entities comprises attributes, states and equations that define its dynamic behavior.

In a general aspect, a method includes running a model that includes software entities in a mode that combines continuous-time simulation and discrete-event simulation. Each of the entities includes an instantiation of an entity type definition that corresponds to a real-world feature of a real-world system that is a subject of the model. Each of the entity type definitions includes a discrete stand-alone software unit that can reused with other entity type definitions in other models.

In a general aspect, a method includes exposing to a user a graphical user interface that enables the user to define entity type definitions for entities to be used in running a model that simulates operation of a real-world system, the entities representing real-world features of the real world system. The graphical user interface represents the entities and other elements of the model as icons that can be moved in a workspace and connected to represent a structure of the model. The method includes forming and storing the elements of the model in a form that corresponds to the structure defined by the user.

In a general aspect, a computer-implemented simulation platform includes a model definition module configured to store a definition of a model of a system. The model includes a plurality of interrelated entities, each entity representing a component of the system. The simulation platform includes a simulation module configured to execute the model, including determining changes in one or more of the entities over time, and a results module configured to provide results of the model execution to a user.

Embodiments may include one or more of the following. The simulation module is configured to determine continuous changes in one or more of the entities.

The simulation module is configured to determine a state of the system at a particular time.

The model definition module is distributed over a plurality of computing systems.

The results module is configured to store the results of the model execution in a data structure.

The results module is configured to display the results of the model execution on a user interface.

Each entity includes variables, attributes, data, actions, or a combination of any two or more of them. In some cases, the plurality of entities are organized into one or more collections based on one or more attributes of the entities. In some cases, at least some of the plurality of entities are organized into one or more collections based on one or more attributes of the entities and one or more variables of the entities.

The model definition module is configured to store a plurality of definitions of the model, the plurality of definitions corresponding to versions of the model. In some cases, the results module is configured to store results of the execution of one or more of the versions of the model in a data structure.

In a general aspect, a computer-implemented method includes defining a model, including specifying one or more entity definitions, creating one or more entities according to each entity definition, each entity representing a component of the system, and specifying relationships among the one or more entities. The method includes executing the model, including determining changes in one or more of the entities over time.

Embodiments may include one or more of the following.

Executing the model includes creating a new entity in the model during execution of the model, removing an entity from the model during execution of the model, or both. In some cases, creating a new entity in the model includes splitting a pre-existing entity into two or more entities. In some cases, removing an entity from the model includes merging two or more pre-existing entities into a single entity.

Executing the model includes determining continuous changes, discrete changes, or both, over time in one or more of the entities.

Specifying an entity definition includes specifying properties for entities created according to the entity definition.

Specifying an entity definition includes specifying the entity definition based on one or more other entity type definitions.

Defining the model includes defining the model using a graphical user interface.

Defining the model includes generating a graphical representation of the model.

In a general aspect, a method includes defining a model that can be run by a computer to simulate operation of a real-world system that includes real-world features, including defining one or more entity type definitions, including defining at least one entity type definition based on one or more previously defined entity type definitions and creating one or more entities according to each entity definition, the entities corresponding to real-world features. The method includes executing the model, including determining changes in one or more of the entities over time.

The systems and methods described here have advantages, including one or more of the following. The modeling and simulation approach described here can represent complex real-world systems in a manner that is easy to use and easy to understand. The approach can provide a modeling interface and a modeling methodology that can help to increase the productivity of model builders. The approach can be used by policy makers, business people, or other users who may not have technical modeling experience.

The modeling and simulation approach described here can enable the integration of empirical data about a system for calibration and validation of a model of the system. The approach can be modular, enabling multiple users or groups of users to collaborate on the development or application of a model. The approach can provide fast, efficient execution of the model.

These and other aspects, features, and implementations, and combinations of them, can be expressed as methods, apparatus, systems, components, software products, business methods, means and steps for performing functions, and in other ways.

Other features and advantages will be apparent from the following description and from the claims.

DESCRIPTION

FIGS. 10-12 are diagrams of equation editor windows.

We describe here a modeling and simulation approach (and a corresponding platform) that is specifically designed to enable building, debugging, running, and using realistic models of large and complex dynamic systems. In many cases realistic models of these types of dynamic systems are currently impractical due to the difficulty, time, or expense required for a modeling team to build the model, manage data, calibrate and check the model, evaluate the results, and collaborate and communicate policy recommendations.

In some implementations, the modeling and simulation approach and platform described here (which we sometimes also call the "platform") extends the capabilities of system dynamics modeling to provide new capabilities that enable effective modeling of large and complex systems that evolve over time. These new capabilities yield the following advantages, among others, 1) making it much easier to represent certain real-world systems, 2) enabling integration of empirical data for distributions as well as time series for realistic calibration and validation of models, 3) providing an interface and methodology that increases the productivity of model builders, or 4) reducing the difficulty of direct use by policy and business people as well as engineers and scientists, or a combination of any two or more of these capabilities.

When we refer to systems as being large and complex we mean systems for which adequate models of studied behavior include many interrelated components of multiple types. Such systems can include a wide range of applications, including many systems for which models have been developed, but where the effectiveness of these modeling efforts have been limited by expense, difficulty, or the inability to adequately represent certain aspects of system structure and behavior, or a combination of any two or more of these limiting factors. For instance, examples of large and complex systems include integrated economic, energy, environmental, and societal models; city and regional development models; large project and project portfolio management; international market development; national health care systems; and product portfolio management. To accurately model many of these systems, serious models from several areas of expertise can be connected.

In some implementations, the platform can help spreadsheet users (that is, those who use spreadsheets as platforms for building and using models) deal with complex planning, forecasting, and analysis problems, and achieve greater accuracy, understanding, and productivity. Moreover, the platform can enable tackling complex systems beyond the scope of spreadsheet analysis. The platform can enable subject knowledgeable people and groups to accomplish these goals without advanced training in simulation techniques.

Figure 1:
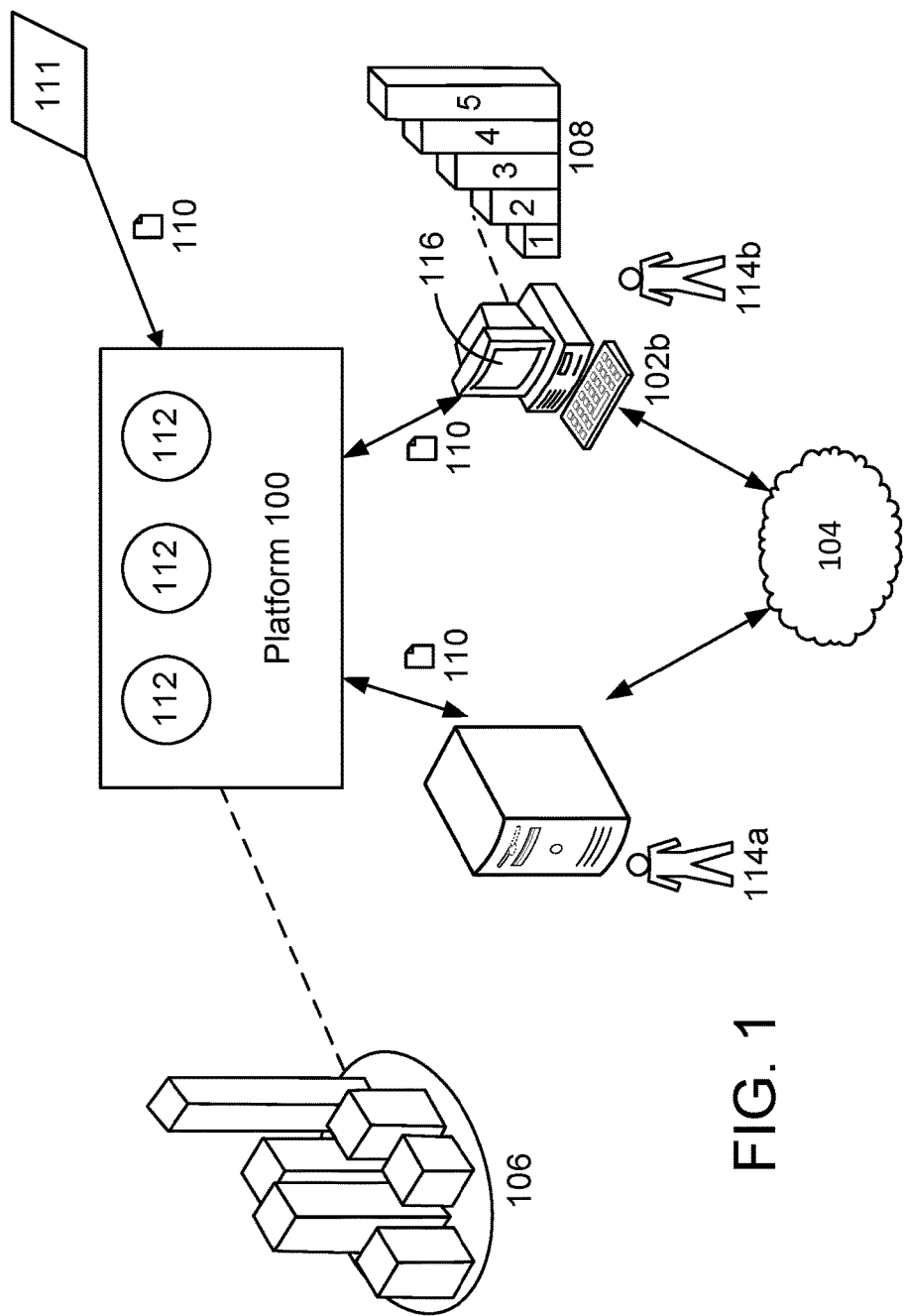
FIG. 1 is a diagram of a modeling and simulation approach.

Referring to FIG. 1, in general, a modeling and simulation platform 100 is hosted on one or more computer systems 102a, 102b, such as personal computer, server, or other types of computer systems. The computer systems 102a, 102b are linked by a computer network, such as the Internet 104 or another type of computer network. The platform 100 can model systems 106, such as a city, a business, a market, an entity, a subpart of any of them, or any other type of system, to generate predictive results 108 about a future state of the system 106.

Data 110 about the system 106 to be modeled is provided to the platform 100 by one or more of the computer systems 102a, 102b, from one or more publicly available data sources 111, or from another type of data source, or can be entered manually by one or more users, or can be provided in any other possible way. Model components 112 in the platform 100 are configured by one or more users 114a, 114b to generate the predictive results 108 based on the data 110. The results 108 may be displayed on a user interface 116, e.g., on one of the computer systems 102a, 102b or on a separate computer system, such as a personal computer, mobile computing device, or other type of computer system.

Dynamic Simulation Systems and Methodologies

Many simulation software applications are provided as integrated development environments (IDE) that include capabilities for model definition, simulation, and results analysis. In some implementations, the kind of platform described here is provided as an IDE that facilitates high quality treatment of strategic and complex problems of the highest importance, among others.

In some implementations, the platform described here can provide an easily accessible approach to developing, using, and trusting simulation models that provide a rich representation of reality, including of systems that are very large or very complex or both. Design effectiveness of a modeling and simulation platform can generally be determined by one or more factors including, e.g., the functional capabilities and capacity of the platform (we sometimes use the term platform interchangeably with the terms methodology, approach, system, IDE, and technique, among others) to model the target problem, the level of difficulty in using the platform to achieve desired results, the learning curve and level of expertise appropriate for using the platform, the level of productivity enabled by the platform, or the presentation of the results in a manner to inspire appropriate confidence in the results, or a combination of any two or more of these factors.

The degree of realism and predictive ability achieved by a modeling and simulation platform moreover can depend on the availability of empirical data about the system being modeled or the environment of the system, or both, for calibrating and validating a model, the ability of the platform to support the integration of empirical data as inputs in order for models of complex systems to represent accurately their real-world counterparts, or both. Modeling effectiveness and usefulness in assisting decision-making in time-critical situations can also be determined by simulation execution performance.

Implementations of the platform described here can provide an approach to system dynamics simulation and continuous simulation problems through features such as functional capabilities, methods that simplify previously complex and tedious implementation, and a technical design that maintains simulation performance even with dynamic changes in structure, and combinations of those features.

In some implementations, the platform also encompasses elements of object-oriented modeling, discrete event modeling, and agent modeling to provide rich, natural representations, modularity, and structure reuse. The impact of these features is that the platform can allow a broad scope of models to be built, can remove implementation obstacles thereby enabling more accurate representation and more realistic models, can make these capabilities available to people with less training and experience, can improve efficiency for expert users, and can present results in a manner that inspires action.

System Dynamics Simulation

System dynamics simulation is a simulation methodology that allows the modeling team to define a behavior using stock and flow equations. Diagram methodology provides a clear local explanation of model variables that impact each other. The equations are independent of each other. The simulation software determines the necessary sequence for performing the calculations.

In general, in typical system dynamics simulation software, variables and array members are established prior to the start of model execution. In other words, no structures or entities (such as new businesses, cities, or elements of them) can be added during a simulation unless empty space is pre-allocated and reserved for the new elements. In addition, distributions, e.g. of income, previous history, credit scores, can be awkward and laborious to represent in standard system dynamics simulation software.

In some implementations, the platform described here can provide the ability to add or remove entities (objects) during execution of a simulation. The platform can provide capabilities to work with collections of entities and to make these additions, deletions, and other changes to the entities available for review and analysis.

In general, in typical system dynamics simulation models (such as those implemented using Vensim® (available from Ventana Systems, Inc., Harvard, Mass.) or with the DYNAMO (Dynamic Models) programming language) are global in scope. A variable name cannot be reused elsewhere in the model. Some replication of structure may be achieved at initialization through the use of arrays with subscripts. Large system dynamics simulation models typically use multi-dimensional arrays to represent relationships between the members of other arrays in which space for an entire multi-dimensional array maybe allocated but only a small portion of the array may actually be populated.

In some implementations, the platform described here can provide collections and collections of relationships rather than subscripts or arrays, enabling clean and straightforward notation to be used. In addition, the collection framework contributes to fast execution times for the platform described here.

Event Simulation

System dynamics simulation uses continuous integration to simulate or calculate the values of each system variable at each time interval during the simulation, continuously updating the states of the system. Discrete event simulations model system behavior as a sequence of individual events that occur at various discrete times. An event may be, e.g., an arrival from outside of the system or completion of some process within the model. In some cases, each step in a multi-step process may schedule the next event. Discrete event simulation is generally used for tactical operational and process simulation. Discrete event simulation generally focuses on physical activities or systems where the primary determinants of behavior are the timing relationships of activities, for example, factory process design, customer service activities, or hospital emergency rooms. Discrete event simulation can provide time sensitive queue management and other process oriented capabilities but is generally not used for strategic planning or for studying systems that have widespread feedback relationships.

The platform described here can provide an integrated capability to combine continuous simulation with discrete events.

Agent-Based Systems

Agent-based models generally represent systems with large numbers of agents using detailed sub-models of one or several types of agents. Each agent has individual properties that may be elemental or for aggregate agents the collective outcome of the properties and interactions of its constituents. In some agent-based models, agents have included pedestrians, vehicles, firms, individual people, and small groups of people. Agents may include static and dynamic attributes describing the nature of the agent as well as mechanisms for interacting with other agents and the surrounding environment. Agent-based methodology is generally appropriate where interactions among the agents are the primary driver of system behavior, and where this agent interaction gives rise to emergent patterns that cannot be satisfactorily represented at an aggregate level. Agent-based modeling is seldom successfully applied to complex strategy and policy problems.

In some implementations, the platform described here can represent agents and generate detailed and collection-level aggregate results that can be used to calibrate models and validate system behavior.

Spreadsheets

Spreadsheets are the most widely used software programs for planning, forecasting, and business simulation. Spreadsheet models range from simple sales forecasts and one-worksheet business plans to very large models including software that may not be visible in the main view of the spreadsheet. Spreadsheets can be difficult to use on complex problems, e.g., where detail and dynamic complexity exceed the natural two or three dimensions of worksheets and workbooks. Several studies of costly spreadsheet problems have identified hidden assumptions and undetected errors. While spreadsheets provide good visibility of numbers, spreadsheets can lack abstractions that provide for transparency of model structure and top-down organization of a complex model.

In some implementations, the conceptual framework and user interface of the platform described here can provide well developed transparency and organization capabilities.

Combined Methodology Software

Many complex systems cannot be adequately represented using any single methodology. The platform described here integrates multiple modeling paradigms, for instance, by incorporating continuous system dynamics simulation together with discrete events and agent capabilities. Discrete events such as transactions can be represented using the same construction as continuous rates and flows. Entities may represent physical units, organizations, high level systems, production facilities, relationships, abstractions, and many other system components. Model definition in the platform described here can be declarative and non-procedural, and can also provide many object oriented design benefits including reusability, dynamic structural changes, and relationship lists.

Platform Architecture

In some implementations, the platform described here provides an application structure that is based on entity definition and the design of a language, graphical representations, compiler, and simulation engine that deliver the new features, or combinations of two or more of them.

Among others, a goal of the platform is to enhance modeler productivity in delivering better decisions, through one or more of the following capabilities:

Models with a natural representation of reality
Analysis using sophisticated calibration, optimization and sensitivity simulation
An appreciation of risk and uncertainty
Interactive analysis, online, gaming or educational experiences In some implementations, particular combinations of features can be incorporated into the platform to deliver on this promise:

Rich representation of reality in the model, including
  Stocks, flows and other elements commonly used to represent reality mathematically
  Support for high dimensionality and sparse arrays
  Dynamic creation and removal of structure during execution of the model
  Ability to represent real-world concepts at any level of granularity that the user can understand
  Structure that corresponds with operational systems and granularity of available data
Rapid construction of the model
  Abstractions that free the modeler from detailed management of time and events
  Structure reuse and modularity
  Automated equation generation from graphical representations
  Freedom from programming using code (e.g., procedural code or text code without graphical representations)
  Team collaboration support
  Ready access to model elements appropriate to the current task
Integrated quality control, requiring minimal user intervention
  Graphical conventions facilitating inspection and preventing construction of erroneous structures
  Automatic checking of units and conservation laws
  Conditional execution of quality control tests
  Ability to execute portions of model structure in isolated test beds
Replicability, which is the ability to repeat and explain model results
  Equations that are largely transparent or self-documenting
  Scenario and model version control that permits reproduction of past results
Speed of execution, supporting
  Interactive simulation
  Algorithms requiring many executions
  Easy connections to data input and output and operational systems In some implementations, the platform functions include, e.g., one or combinations of any two or more of model definition, model run management, data preparation, run preparation, model compilation, model execution, and results analysis. These capabilities can be made available on personal computers, on mobile computing devices (e.g., smartphones or tablets), or through a web interface, or a combination of any two or more of these. Model compilation and execution can also be implemented as server/cloud services, and as embedded functions that can drive simulation applications on personal computers, web servers, and mobile devices.

Model Definition

In some embodiments, the platform is provided as an Integrated Development Environment (IDE) that provides access to some or all of the capabilities of the platform in a "development studio" environment. One or more modeling projects may be established in the IDE. Each modeling project may contain model definitions, scenario and run definitions, input and reference data, or simulation results, or a combination of any two or more of these.

Figure 2:
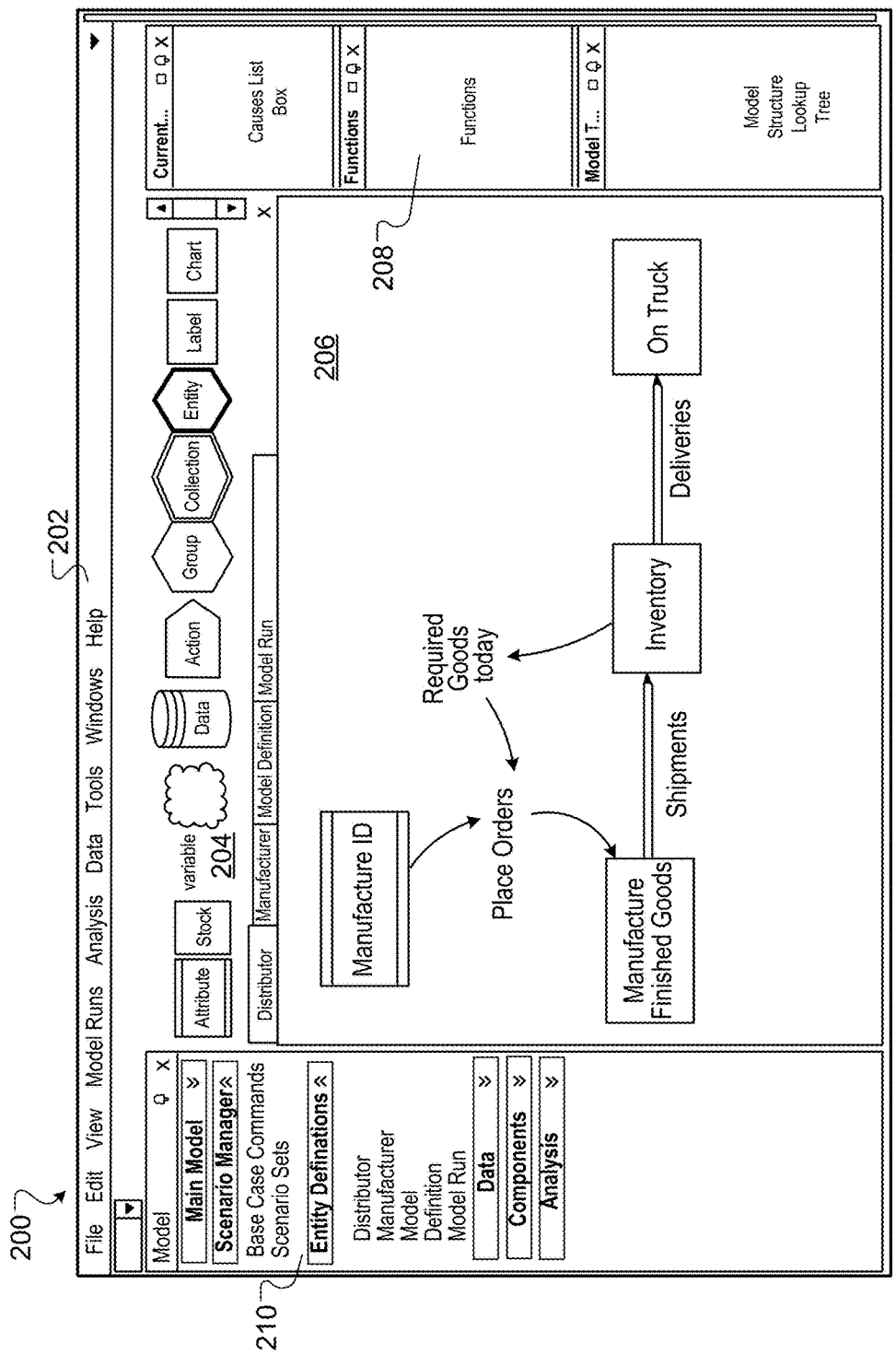
FIG. 2 is a diagram of a development environment.

Referring to FIG. 2, a screen shot shows an initial view of an IDE 200 of the platform. The IDE 200 includes some or all of the components that can be used to build and run a model in the platform.

The IDE may include one or more of the following components:

Menu bar and tool bar (not shown)—provides access to application functions.
Navigation Panel 202—provides access to application functions and specific content.
Drawing palettes (node palette 204 shown)—used to draw diagrams and displays. Other example drawing palettes may include, e.g., a color palette, a font palette, and other types of palettes.
Tabbed work area 206 (which we sometimes also call a workspace) that supports docking or floating windows for diagrams, data grids, and charts.
Modal and non-modal dialogs, such as a function list 208 or an equation editor. A modal dialog demands attention from a user by preventing any other components of the IDE from operating while the modal dialog is open. A non-modal dialog allows other components of the IDE to continue operating while the non-modal dialog is open.
Reference and navigation lists 210 that provide access to model content and features. These can include a list of system functions, model structure trees, or context specific causes lists, or a combination of any two or more of these. These lists can be used in docked or floating windows.

Figure 3:
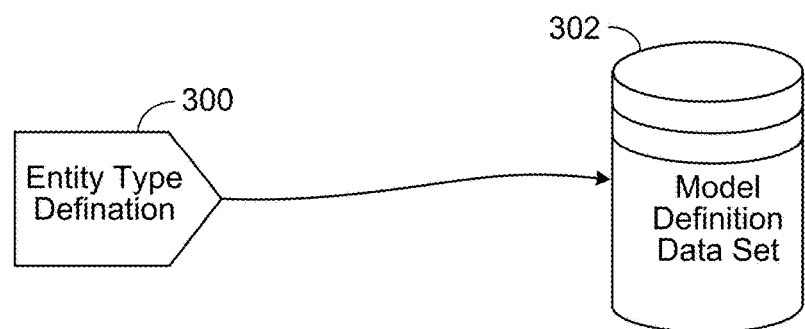
FIGS. 3 and 4 are block diagrams.

A key function of model definition is to define the entity types that will be used in the model. A model definition may include many entity types. Entity types from one model may reference entity types from other models. Referring to FIG. 3, model definitions, entity definitions, or both 300 may be stored in a Data Set 302 of tables that can reside in a database, in XML files, and other suitable formats.

Entity Oriented Design

Each model contained in the platform is organized as entities, each having a distinct existence within the model. A model itself is an entity, and therefore models may be embedded within other models. All model content is contained in entities. Entities may represent a wide range of model components including physical entities, organizations, facilities, products, logical collections, and abstractions. For instance, example entities include a restaurant, a power plant, a fire department, a bank, and a project task pre-requisite. An entity is frequently defined as something that has a unique existence. Each entity within the platform is separate from each other entity within the platform and may be uniquely identified.

Figure 4:
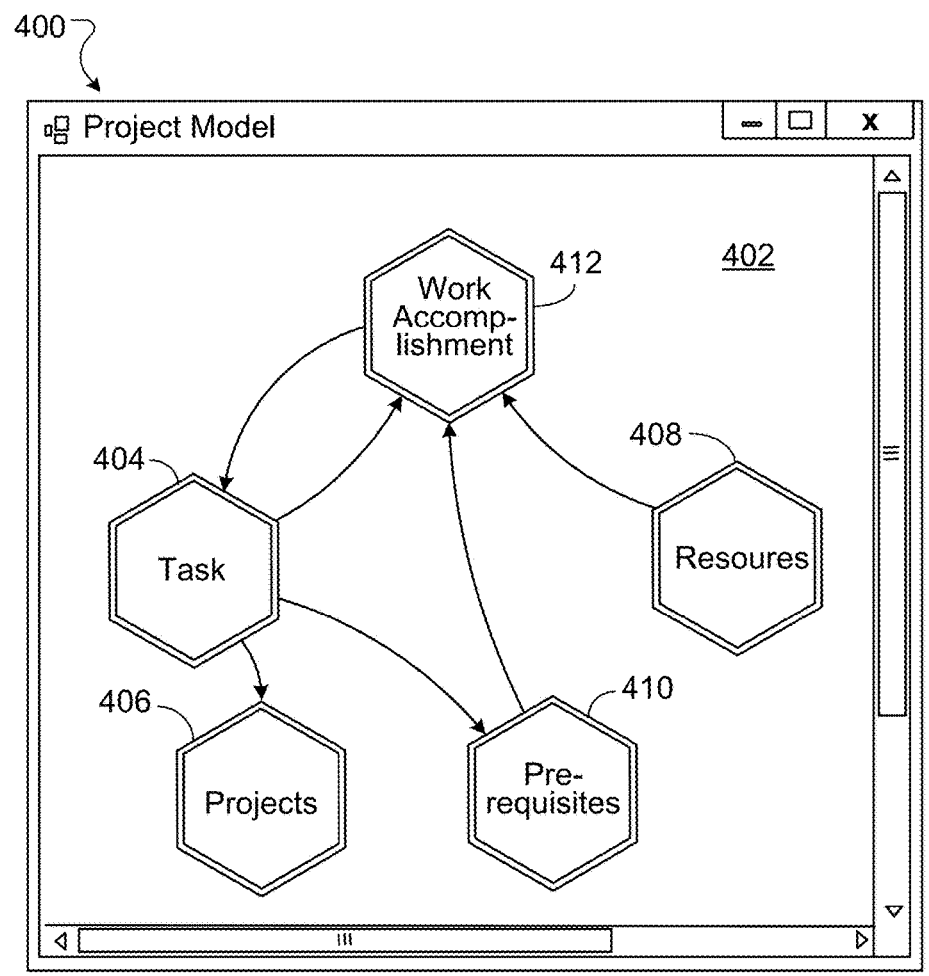

A single entity type definition acts as a template that can be used to create many individual entities by setting entity properties specific to each entity according to the template. The entities created according to a particular entity type definition can be grouped together as a collection. A model may include collections of entities of various types. One way of viewing model structure is to show the major types of entities and relationships among them. Referring to FIG. 4, a high level view 400 shows a simple project model 402 that has five collections of entities. The collections of entities are Tasks 404, Projects 406, Resources 408, Pre-Requisites 410, and Work Accomplishment 412. The entity type for each collection is defined in detail. Each entity type definition includes definitions for some or all of the following components of an entity, including stock, flow, and auxiliary variables, attributes, data, actions, groups, or collections, or a combination of any two or more of these components (each of which is described in greater detail below). The definitions include the detail of the interconnections among entity types. Once the model is complete, instances of entities can be created and eliminated in each collection even during the execution of the model.

The platform includes a non-procedural language for defining entities and their sub-components (e.g., variables, links, equations, and other sub-components, discussed in more detail below), a graphical representation of some or all of the entities and their sub-components contained in the model, and the ability to support system dynamics simulation, discrete event simulation, and agent-based modeling and any combination of two or more of them within a single methodology and model. A non-procedural language (also known as a declarative language) is a language that does not require that a model builder specify a sequence (procedure) for processing the simulation. The model builder can specify only equations and logical relationships, and the platform can determine the order and processing that will achieve the result that is determined by the model definition and the applied data.

Every entity represented in the model can be created using an entity type definition. An entity type definition (ETD) identifies the properties which model the "state" of the entity at any point in time. The ETD also includes rules and equations which determine how an entity changes during simulation. The ETD may be created, modified, and viewed in tabular mode (e.g., FIG. 8, described in more detail below), diagrammatic mode (e.g., FIG. 7, described in more detail below), or both. The notion of entity type definition shares some characteristics of object-oriented programming and object-oriented modeling. Entity type definition supports basic system dynamics simulation stock-flow diagrams and non-procedural equations.

The platform extends the system dynamics simulation methodology by providing direct support for (that is, enabling a user easily to provide for) large (including exceedingly large) numbers of entities and the relationships among them. Entities may support discrete event scheduling. The platform also supports creating, merging, splitting, and deleting entities during the course of a simulation. This design approach provides some agent-modeling capabilities while retaining diagrammatic and non-procedural specification in the spirit of system dynamics simulation.

The platform can provide some or all of the key benefits of object-oriented design that relate to dynamic simulation, without requiring programming expertise. These key benefits include one or more of the following: the ability to create and delete entities, the ability to override equations (methods), and the ability to base an entity type definition on another entity type definition (inheritance and multiple inheritance). The platform also includes aspects of relational data management, discrete event simulation, and agent-based modeling.

Figure 5:
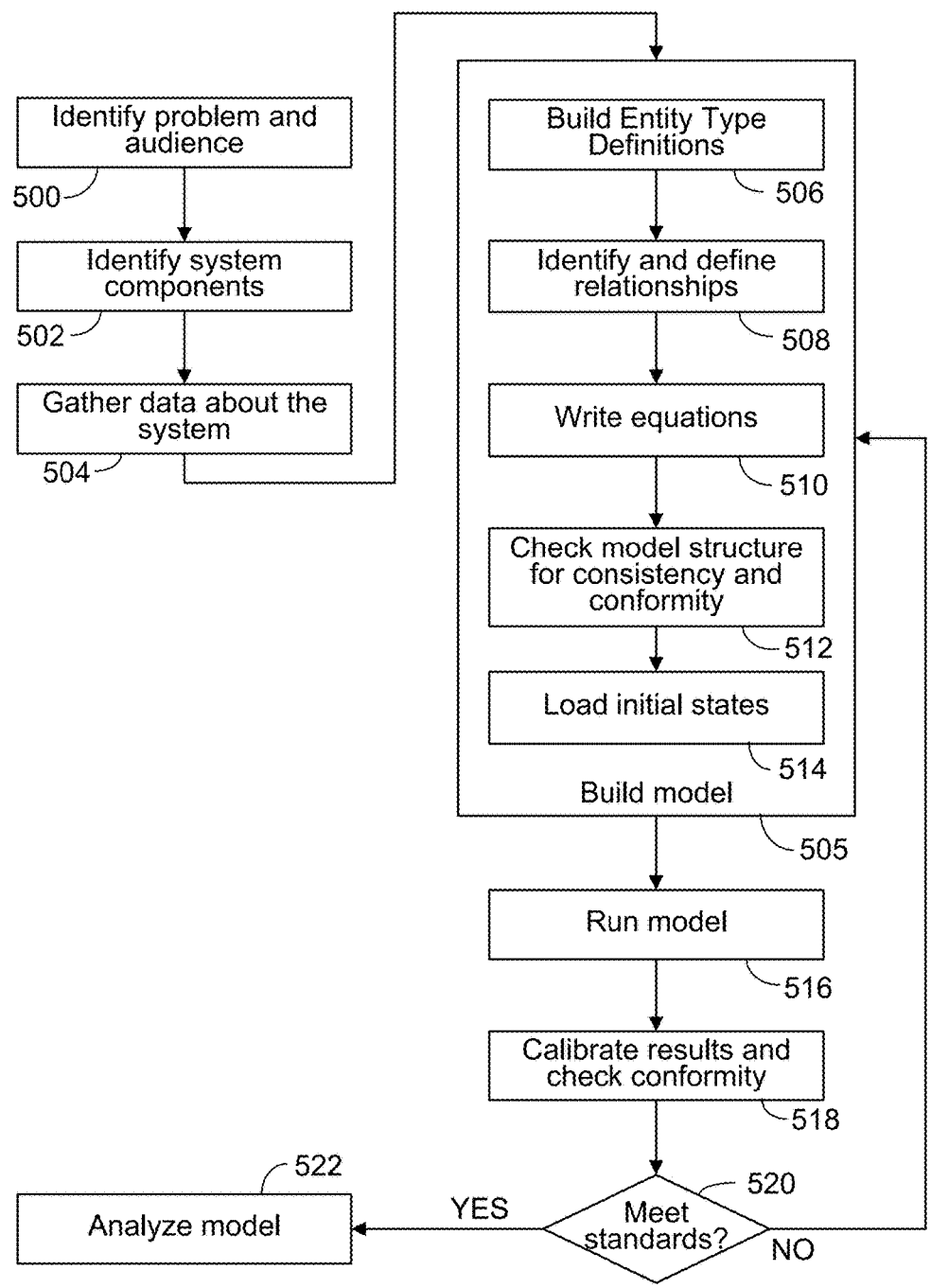
FIG. 5 is a flow chart.

Building a simulation model using the platform formalizes aspects of both top down and object-oriented design. Referring to FIG. 5, to build a model using the platform, a problem to be solved and an audience for the solution are identified (500). For example, a target audience for a project model may be project managers, clients for the project, or other stakeholders, or a combination of any two or more of them.

Components of a real-world system associated with the problem are identified (502). For example, in a project model the components may include tasks to be completed for the project, available resources, prerequisites for completion of the project as a whole or for completion of one or more individual tasks, a tracking of work accomplishments, and project summary parameters and results.

Data about the system is gathered (504) as needed to develop a model of the system and as is possible to gather (e.g., as available). For example, task information can be loaded from a project plan's work breakdown structure. Resource and pre-requisite information can be retrieved from a project management system. Project summary information can be entered manually or determined based on policy estimates. In this example, the work accomplishment components are used to calculate project progress and do not rely on any external data.

A model is built for the system (505). To build the model, an entity type definition is built for each component (506) using the platform. One or more attributes may be defined to be used as a unique identifier for each component. Entity definition activity may be distributed among remote collaborators. For instance, users working in separate locations with separate computers may each access the platform and build entity type definitions for different components or may collaborate on building a single entity type definition. For example, for a national energy model, separate groups of experts may each work separately on oil, coal, nuclear, natural gas, and wind power production. Additional teams may work separately on pipelines and the electricity distribution system.

Relationships among various types of components and entity type definitions are identified and defined (508) using the platform. Attributes can be used to identify the primary components in each relationship. For example, the work accomplishment entity in the project model can combine tasks and resources to calculate progress, where each work accomplishment entity can link to one or more particular tasks and one or more particular resources. Example attributes in the work accomplishment entity can be, e.g., "TaskID" (an identifier of a task) and "ResourceID" (an identifier of a resource).

Equations can be written that describe the change of system components over time (510). The equations can include information about and material connections among entities. For example, in a supply chain model, a retailer entity can use information about current inventory and an estimate of customer demand to generate an order from its supplier. The supplier would then ship the material to the retailer, transferring goods from the supplier inventory to the retailer inventory. These actions can be represented by equations in the model. Some example equations for the retailer's equations can be expressed as follows:

InventoryTarget=SUM(Customer·Order)*Desired Inventory Coverage

OrderToSupplier=MAX(0, Inventory Target−Inventory)/Inventory Adjustment Time

Receiving=SUM(Supplier·Deliveries)

Shipping=SUM(Customer·Order)

The model structure is checked for dimensional consistency and conformity to conservation laws and adjusted if needed (512). Initial entity states, parameters and time series data for the model are loaded (514) and the model is run (516). Each variable (e.g., stocks, flows, auxiliary variables, data, and other variables) has a unit of measure, such as acres, pounds, $/day, or another unit of measure. The platform uses these units to ensure dimensional consistency among variables.

Some variables in the input data can be used as control parameters. By varying the values of the control parameters, the user is able to use the model to evaluate multiple scenarios. Control parameter values can also be used to test model behavior under extreme conditions.

The results of the run are calibrated and the conformity of the results to data and other information, such as plausibility of behavior in extreme conditions is checked (518). If the calibration or conformity does not meet desired calibration or conformity standards (520), the model building is iterated as needed to refine its structure. Other actions may also be taken if the calibration or conformity does not meet its associated standard, such as collecting additional data.

The results of the model are analyzed (522). In some examples, confidence bounds from calibration and a priori inputs can be used together with algorithms to optimize the model to yield effective decisions under uncertainty.

Entity Type Definition User Interface

Figure 6:
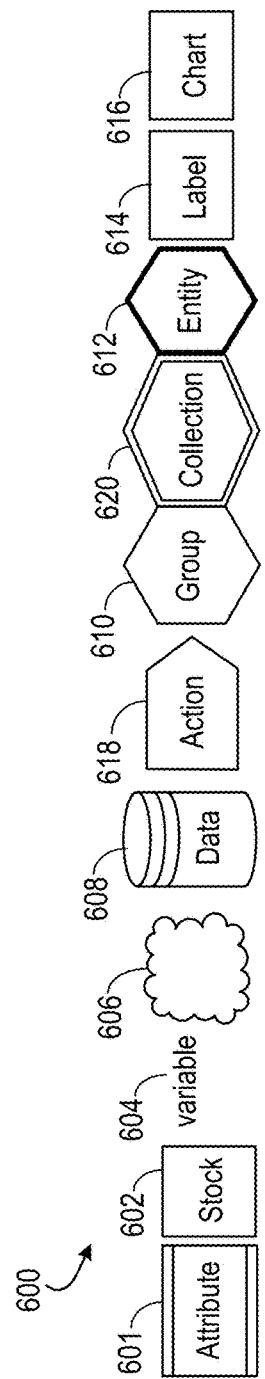
FIG. 6 is a diagram of a drawing palette.

A diagramming interface (e.g., the IDE 200 of FIG. 2) can be used to define entity types. The primary components of the diagramming interface are a tool bar and a diagram workspace (e.g., the work area 206 of FIG. 2). Referring to FIG. 6, an example drawing palette 600 contains some or all of the nodes that can be placed on an entity type diagram that can be generated in the diagram workspace. To add a new item to an entity type definition, the user drags a node into the diagram at the desired location. A new item may also be added using a context menu on the diagram surface.

An attributes node 601 enables an attribute to be added to an entity type definition in the diagram workspace. Attributes are variables that are used to identify, categorize, and logically differentiate entities created from the same entity type definition. Attribute values can be visible to the model user as names and text strings. For instance, an example attribute may be CityName, and the attribute values may be "Boston", "New York", or"Chicago".

A stock node 602 enables a stock variable to be added to an entity type definition in the diagram workspace. Stock variables conform to the standard system dynamics simulation or engineering definition of a stock, level, or state variable. Stocks are real-world accumulations of things which could be counted if all system action were to be frozen in time. For instance, examples of stocks include the number of employees, products, and buildings in a corporation or the number of citizens, jobs, automobiles, and buildings in a city.

Stocks have persistent, continuous real values that may be increased or decreased as the result of flows that enter or leave. Flows are real-world processes that cause stocks to increase or decrease. For instance, examples of flows include corporate flows such as employee arrivals and departures, product introductions and discontinuations, changes in perceived product attractiveness, building acquisition/construction/disposal; and metropolitan flows such as citizen in- and out-migration, job gains and losses, traffic inflows and outflows, building construction/demolition, and other flows.

Stock values can be initialized when an entity is created. Equations for stocks are automatically generated, based on the flows that are connected to them.

An auxiliary variable node 604 enables an auxiliary variable to be added to an entity type definition in the diagram workspace. Auxiliary variables are calculated variables that are based on values available as of the current simulation time. The platform provides built-in functions that allow equations to reference values from prior time periods. Auxiliary variables can be used to calculate flows, to provide clarity to complex formulas, to save important statistics for reports and analysis, etc.

A cloud node 606 enables a cloud to be added to an entity type definition in the diagram workspace. Clouds represent sources or sinks for flows into or out from stocks. In some examples, clouds do not have names and are not tracked. They are used when a flow enters from outside the model boundaries or ends outside of the model boundary.

A data node 608 enables data to be added to an entity type definition in the diagram workspace. Models frequently use data from external sources. Data variables typically contain time series data that may or may not align with the model time frame. Data variables may be used to drive, calibrate, or provide a benchmark for reporting. Data variables may also represent budgets, forecasts, or projections from outside sources or other models. Outside sources may include files, databases, sensors, and other automated systems.

Data structures can represent output from other simulations executed by the platform. Data variables can also use time series structures generated by sub-models that are run during the simulation. This makes it possible to effectively model the impact of forecasts and expectations.

A group node 610 enables a group to be added to an entity type definition in the diagram workspace. Groups are pieces of an entity type that are shown on additional diagrams. Groups are created when the diagram would become too complex or when the content of the group would interfere with the visualization of the entity structure. Very large or complex entity type definitions may include multiple layers of groups. Groups or sub-groups may be easily converted to general purpose entity type definitions that can be reused by other entities or models.

An entity node 612 enables an entity to be added to an entity type definition in the diagram workspace. An entity type may contain other entity type definitions. All of the variables and equations for the included entity become part of the main entity. In this usage, the included entity type does not create an independent entity. Each entity type definition that includes a base entity type definition may set default values for some or all of the attributes and for some or all of the equations from that base entity type definition.

An entity may also create one or more copies of another entity type that are "owned" by the primary entity.

Some simple entities may include model structures that may be better suited as direct content for other entities. These structures can become reusable components that may be included in multiple entity type definitions that may have little or nothing in common.

Labels 614, charts 616, and other interface controls may be used on diagrams to provide a more complete simulation environment.

An action node 618 enables an action to be added to an entity type definition in the diagram workspace. Actions define processing to be performed at one or more discrete times during the execution of the simulation. Action nodes can be used to support discrete event and agent-based modeling capabilities.

Connections

Connections (we sometimes use the terms connection and link interchangeably) may be made among one or more of stocks, auxiliary variables, data, groups, and data. Types of connections include, e.g., information links, causal links, flow connections, reference links, and selection links.

Information connections can be shown as flexible arrows in the diagram workspace. Information connections may originate in entities, data, groups, collections, stocks, or auxiliary variables, and terminate in entities, groups, flows or auxiliary variables. As the name implies, information connections carry information from one element of the model to another.

Links that terminate in auxiliary or flow variables are causal links. These connections indicate causality, i.e., that the terminal of the connection is directly affected by the source of the connection. The originating variable or attribute is used in equations that determine behavior in the terminal variable.

Connections between two stocks or between stocks and clouds represent flows and can be depicted as pipes rather than simple lines. The name of each flow can appear near the middle of the pipe connection. Flows may be expressed as either a continuous rate, with units of the associated stock divided by time, or as a volume, with units of the associated stock, which will occur as a discrete change in the stock at a prescribed time. Flow calculations can be automatically configured by the platform to achieve the correct result.

Ordinary flows decrease the level of the origin stock and increase the level of the destination stock, where both stocks have the same units of measure. At least two special cases can be recognized. A transformation flow can permit the origin and destination stocks to have distinct units, by accounting for the transformation, e.g. from cast iron (tons) to pipe (linear feet). A copy flow can permit an originator holding an intangible item, like an electronic document, to transmit it to some destination, increasing the destination stock without decreasing the origin stock.

Co-flows are parallel stock-flow structures that carry a key quantity (e.g., cars in a fleet) and their qualities (fuel economy, weight, size), with the assumption that the qualities of the key quantities in the stock are well-mixed.

In many cases, a collection of entities representing individuals or cohorts of the key quantity will be a more natural representation. But at other times, it may be desirable to preserve the well-mixed stock assumption. For such cases, the platform can provide a consolidated dialog which contains the key quantity and its qualities, with distinct units of measure. The co-flow stocks and flow coefficient expressions can be listed in a grid dialog. The modeler can define the flows for the key quantity; changes in the key quantity stocks and their associated quality stocks can be automatically generated, reducing effort and errors. Table 1 indicates example special dialogs that can streamline co-flow calculations. A user identifies a primary quantity stock variable (in this example, the stock variable "Vehicles") and its inflow and outflow variables (in this example, "New Cars" and "Scrapped Vehicles"). The below example shows one inflow and one outflow, but the actual dialog is configurable to support more stocks and flows. The quality stocks associated with the quantity stock variable "Vehicles" are "Weighted MPH", "Weighted CO2", and "Total Weight". For the inflow for each quality stock, an expression can be specified that is multiplied by the corresponding flow. These expressions can be used to update the weighted quality values. Outflows can be automatically calculated using the current well-mixed average.

TABLE 1

| Stock Variable Name | InFlow 1 | Average Quality | Outflow 1 |
|---|---|---|---|
| Vehicles (key quantity) | New Cars | — | Scrapped Vehicles |
| Weighted MPH (quality) | (expression) | <auto-calculated> | <auto-calculated> |
| Weighted CO2 (quality) | (expression) | <auto-calculated> | <auto-calculated> |
| Total Weight (quality) | (expression) | <auto-calculated> | <auto-calculated> |

Reference links are connections from attributes to referenced variables from other entities. A reference link indicates that the attribute can be used to determine the specific entity which contains the referenced variable. For example, if the attribute CITYNAME is connected to variable CITY.Tax Rate, and the attribute value for CITYNAME in a particular entity is "Chicago", then the Tax Rate variable would come from the CITY entity which also has a CITYNAME attribute equal to "Chicago".

Selection links are connections from attributes to sub-collections of entities. A selection link indicates that the attribute is used as part or all of the selection specification that determines which entities are included in the sub-collection.

Entity Definition

Figure 7:
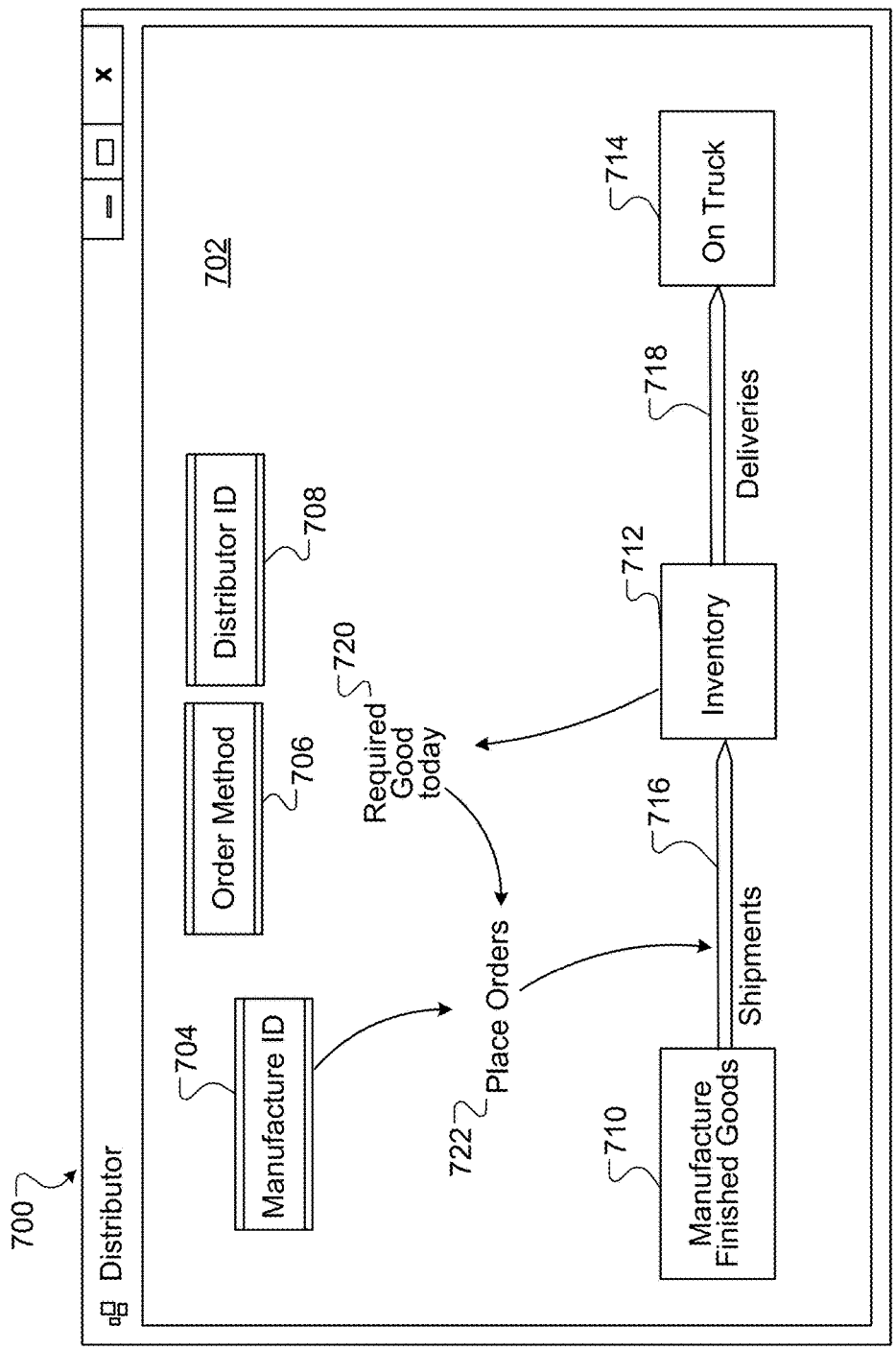
FIG. 7 is a diagram of an entity definition.

Referring to FIG. 7, the primary view 700 for an entity type definition is a diagram 702 with the components of the entity type definition and their relationships. For instance, the diagram 702 for a product ordering and shipping entity includes attributes (Manufacturer ID 704, Order Method 706, Distributor ID 708), Stocks (Manufacturer Finished Goods 710, Inventory 712, On Truck 714), Flows (Shipments 716, Deliveries 718), and Variables (Required Goods Today 720, Place Orders 722). The diagram 702 graphically illustrates the relationships among the constituent components of the product ordering and shipping entity and enables an intuitive, graphical approach to creating, editing, and viewing the entity.

Figure 8:
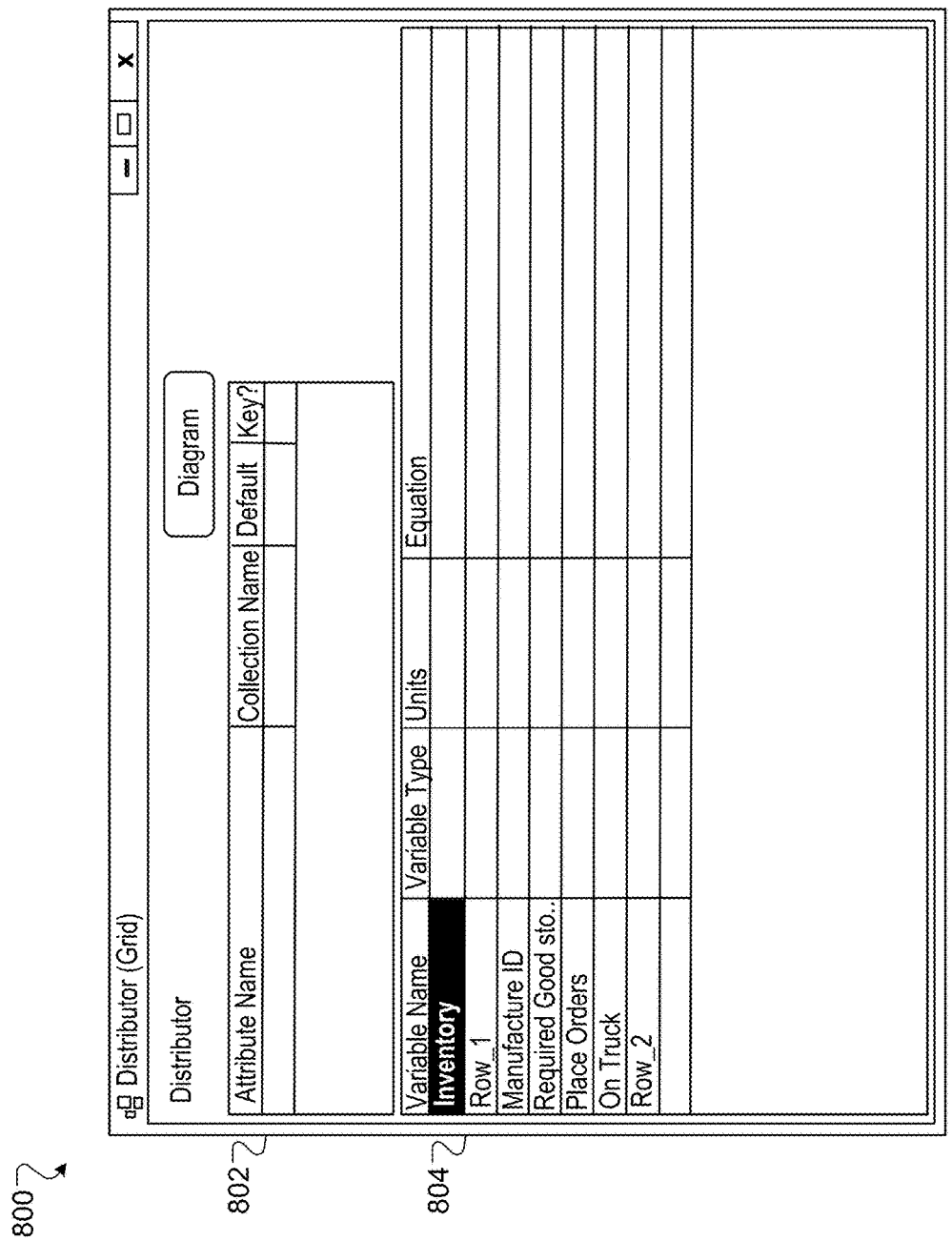
FIG. 8 is a grid view of an entity definition.

Referring to FIG. 8, an entity type grid view 800 is also available that lists all of the entity components in grid structures. The example grid view 800 includes sections for attributes 802 and variables 804. Additional available content can include references to other entity types, actions, sub-groups, and collections.

From either the diagram or grid view, the user is able to access the equation editor and other definition elements.

Attributes

Attributes are variables that are used to identify, categorize, and logically differentiate entities created from the same entity type definition. Attribute values are visible to the model user as names and text strings. Attributes can support the modeling of references, relationships, collections, and aggregated reporting. Attributes may also be used as unique identifiers, as logical states, and to simplify interfaces with organizational databases for both input and output.

Many attribute values are set once when an entity is created and are never changed. Other attributes may be changed during the simulation to record changes in the status or classification of the entity. The possible values for each attribute variable correspond to the unique key attribute of an entity. This correspondence can simplify relationship and lookup tables and enable auto-completion during model entry and modification. For attributes used to manage status or logical condition, the possible values may be set using a simple maintenance screen.

Dynamic status attributes can be used for purposes such as task status (Pending, Active, Complete, Cancelled) or market position (Leader, Mid Size, Boutique). In one example, a "Mortgage" entity can use its "City" attribute to look up the property tax rate. Note that the property tax rate may change separately for each City. In one example, a "Business" model can use a "Development Stage" attribute and a "US State" attribute to set separate logic for startups in each state.

Attribute values can be loaded from data tables that initialize a simulation. The platform can provide optional warnings if some attribute values are not matched in the referenced collection.

REFERENCES AND RELATIONSHIPS

Entity conditional expressions and equations may use the values of variables contained in other entities. These references among entities can be based on matching one or more attribute values from the entity with attribute values from the referenced entity.

Figure 9:
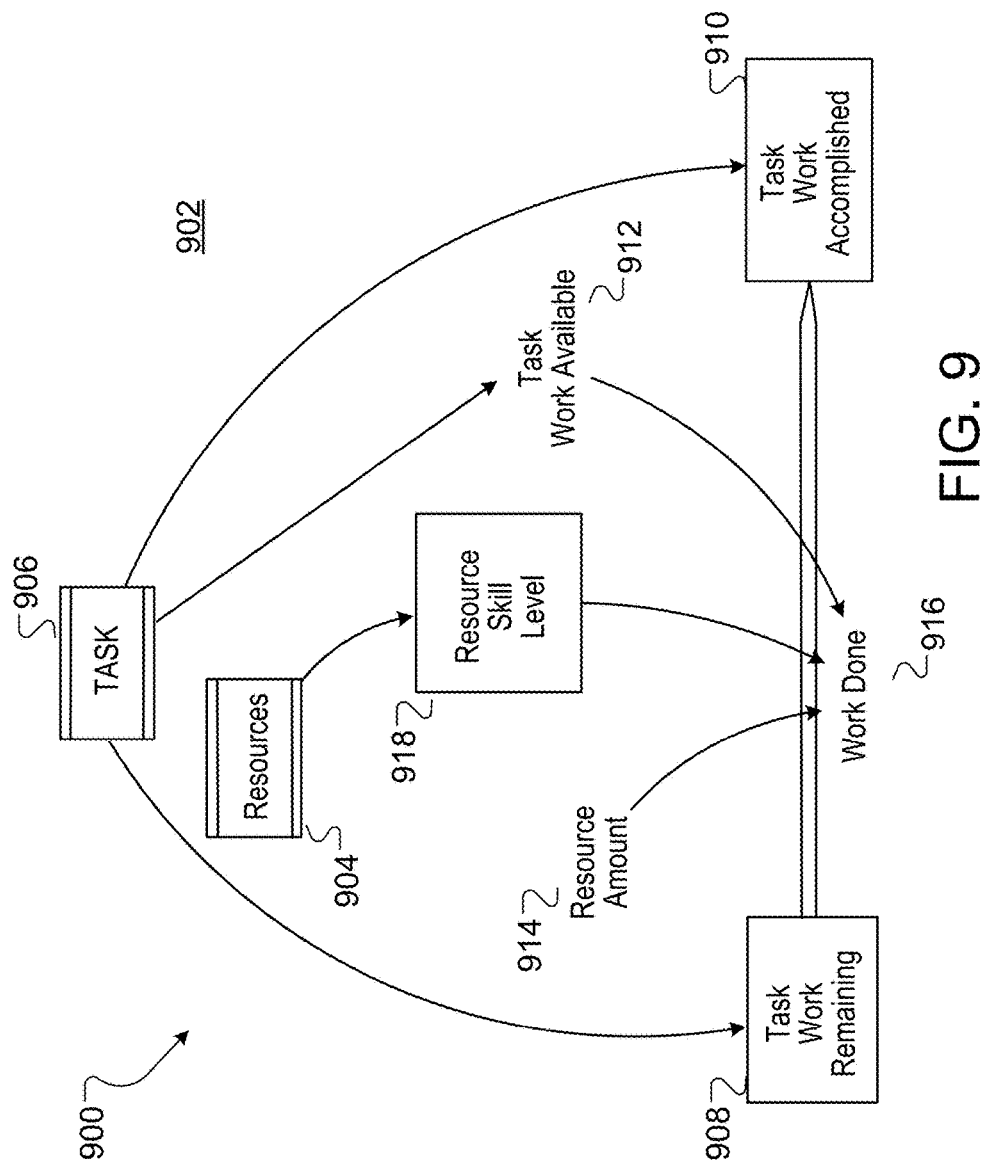
FIG. 9 is a diagram of an entity definition.

Referring to FIG. 9, a diagram 900 illustrates the ability of an entity to affect stock variables in other entities. The diagram depicts a Work Assignment entity 902 that represents the assignment of resources 904 to a task 906. A description of the variables and attributes contained in the Work Assignment entity is shown in Table 2.

The Work Assignment entity 902 references auxiliary variables and stocks from two other entities. The stocks in this diagram are displayed with light gray backgrounds to indicate that they are from another entity. For instance, a Work Remaining stock 908 and a Work Accomplished 910 stock are from an entity type Task. A Task Work Available variable 912 is referenced. The platform allows a user to modify how the elements in an entity definition are displayed. In one example, to connect referenced variables to an entity definition, a user can drag a copy of the desired variables from the entity in which they are defined and place them on the new entity diagram.

TABLE 2

| Variable/Attribute | Description |
| --- | --- |
| TASK 906 | Attribute that identifies the task |
| Resource 904 | Attribute that identifies the resource |
| Resource Amount 914 | Variable that indicates the amount of resources allocated to this task at each point time |
| Work Done 916 | Flow that indicates the work accomplished during one time period. The Work Done variable can be calculated based on all of the inputs. |

TABLE 2-continued

| Variable/Attribute | Description |
| --- | --- |
| Resource.Skill Level 918 | Stock that refers to the skill level of the assigned resource. The link from the Resource ID will automatically match an entry in the resource table. (This is only an example that illustrates how various factors can be used in equations.) |
| Task.Work Available 912 | Variable that indicates how much of the remaining task work is actually available. The TASK link is used to automatically link all of the Task variables that are referenced. |
| Task.Work Remaining 908 | Stock that is decreased by the Work Done flow 916. |
| Task.Work Accomplished 910 | Stock that is increased by the Work Done flow 916. |

The use of attributes in entity definitions can eliminate sparse matrix issues. A sparse matrix problem exists when components with two or more dimensions are modeled. When arrays, such as two-dimensional arrays (matrices) or multi-dimensional arrays, are used to model real-world items, some or most of the array elements may not be defined or used—hence the term sparse array.

For example, one can categorize vehicles by fuel type (gasoline, diesel, natural gas) and propulsion technology (internal combustion, hybrid, fuel cell). But in practice, many elements of the matrix of vehicle combinations may not exist, as shown in Table 3.

TABLE 3

| | Gasoline | Diesel | Natural Gas |
| --- | --- | --- | --- |
| ICE | ✓ | ✓ | ✓ |
| Hybrid | ✓ | | |
| Fuel Cell | | | ✓ |

Similarly, the precedence relationships among phases of a project, the network of origin-destination combinations of flights to airports, and the relationships in a supply chain may even be much sparser than the vehicle example. By using attributes to identify entities instead of array subscripts, the model can deal with a list of only the entities that are actually needed for the model. This can generate large computational savings by eliminating the need to account for every element in an array, even an empty element.

Equations

Changes in a model during simulation are determined by equations. Equations include algebraic expressions that include model variable references and function calls. Some example components of equations are shown in Table 4.

TABLE 4

| Equations Components (Right-Hand-Side elements) | Format |
| --- | --- |
| Constants | Real values (ex: 3.14159) |
| Variables from the same entity | Variable Name (ex: "Cash") |
| Variables from a related entity | Entity Reference.Variable Name (ex: City.Tax Rate) |
| Number of items in a collection | Collection Reference.COUNT (ex: "Restaurants.COUNT") |
| Number of items in a collection subset (filtered by an attribute) | Collection Reference.COUNT (ex: "Restaurants[CITY].COUNT") |
| Aggregate function of a variable from a collection | Aggregate Function (Collection Reference.Variable Name) (ex: "Average (Restaurants.Revenue) |

TABLE 4-continued

| Equations Components (Right-Hand-Side elements) | Format |
| --- | --- |
| Function calls | Function arguments vary by function. They may include values, entity references, and collection references. |
| IF-THEN-ELSE | Conditional logic may be embedded in the equation, but all paths define a value. Only the path taken may actually be calculated. |

References to other entities and collections of entities are often the primary mechanism for identifying the factors that drive system behavior in many models. A reference to a variable in another entity specifies the type of entity, which specific instance of that entity, and which variable. The platform can include several ease-of-use features to make this specification as easy as possible. The type of entity is straightforward. Which entity is determined by matching one or more attributes in the primary entity with one or more attributes in the entity that is being referenced. Example alternate formats may include the formats shown in Table 5.

TABLE 5

| Format | Example |
| --- | --- |
| EntityType["literal string"].Variable | City["Chicago"].Population |
| Entity Type[AttributeName].Variable | City[CityName].Population |
| AttributeName.Variable | CityName.Population |
| ShortName.Variable | CityS.Population |

In the examples shown in Table 5, the referenced entity type is City. The first reference is to "Chicago", regardless of the entity being processed. The second reference uses the CityName attribute of the primary entity. Because the specification for the CityName attribute can specify the entity type to which it is a key, the third format is simply shorthand for the second method. The fourth choice is to use a "Reference Abbreviation" that may, in some cases, increase clarity. The example above assumes that "Define CityS as City[CityName] has been established in the dialog for the entity.

Collections are sets of entities of a particular type. References to collections may refer to all such entities in the model or the reference may be qualified by selecting values corresponding with particular values of one or more attributes in the referenced entity. When attributes are used as qualifiers, some of the sub-collections so selected may be empty.

Equation specification is a key step in building a model in the platform. Flow equations determine how stocks change over time. Auxiliary equations can be used to clarify complex relationships and to generate decision, statistical, or reporting information. Data equations may be used to convert external inputs into a form most useful for the model.

An equation editor is included in the platform to provide an interface for equation specification. The equation editor dialog may also provide "variable definition" functionality also. The equation editor dialogs can be non-modal and remain live during a session. Many dialogs may be open at one time. This can greatly enhance modeler productivity by making it easy to work with shared content. User interface capabilities such as drag-and-drop, cut-and-paste, context menus, and navigation can be supported within dialogs, among multiple dialogs, and between equation dialogs and other model definition objects including diagrams, model structure trees, and analysis plots. Text entry boxes, particularly for the equation itself, support context sensitive auto-completion. This enhances the model builder's experience and also reduces both typographical and logical errors. These capabilities can be supported for use among multiple models open during an interactive session.

In some examples, the equation editor is similar to the Vensim® equation editor and includes further functionality and user interface capabilities.

The following example demonstrates the equation editor capabilities using a "flow" variable. The dialog is slightly different for auxiliary variables. Dialogs for other components are specific to the definitional properties and requirements for those components such as attributes and stocks.

Figure 10:
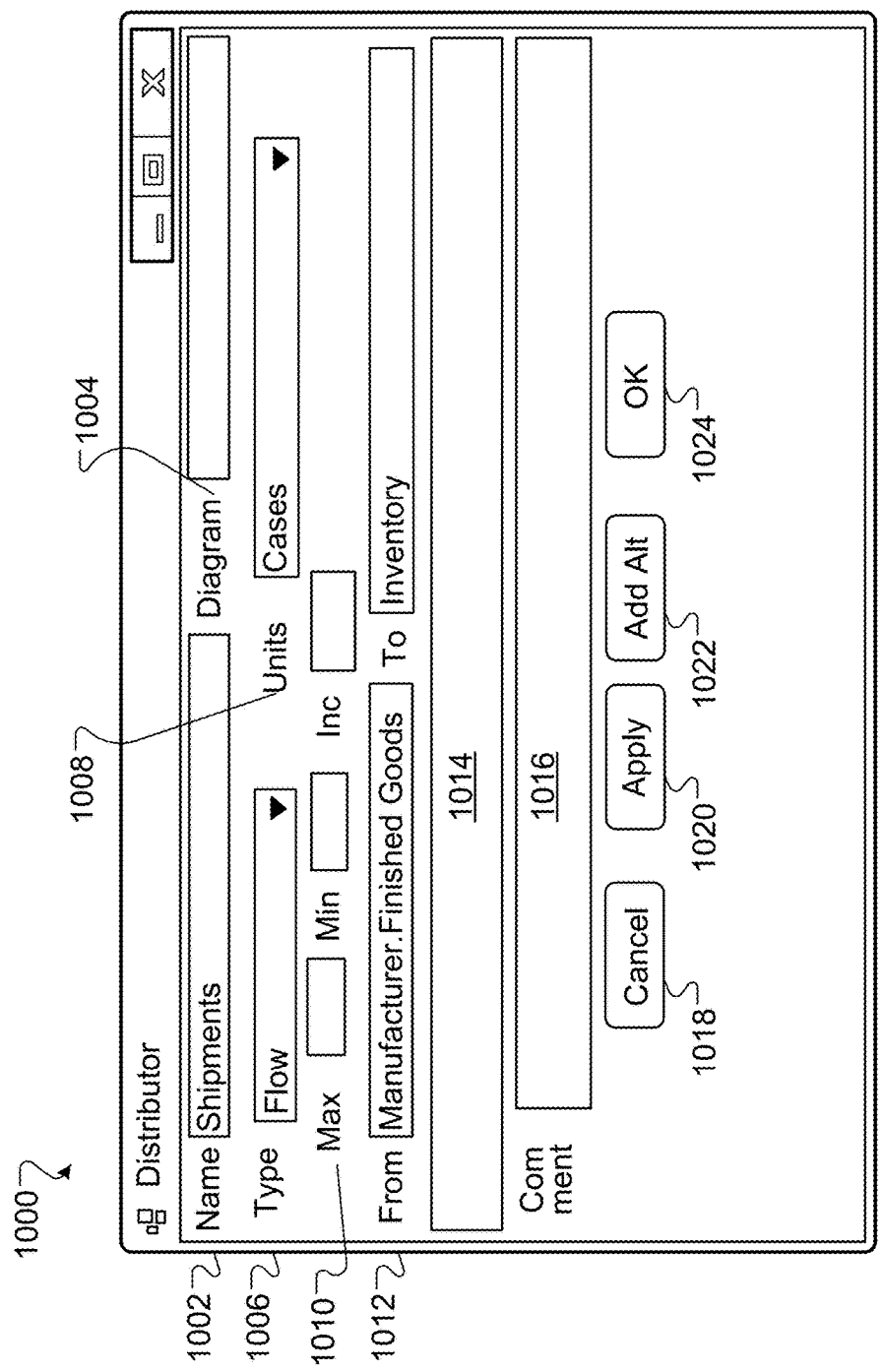

Referring to FIG. 10, an equation editor window 1000 may be used to create initial definitions or to review or modify those definitions. The equation editor window may include some or all of control items listed in Table 6:

TABLE 6

| Control Item | Description |
| --- | --- |
| Name 1002 | The variable name is initialized when the dialog is opened. Other information that has been previously defined is also included. The variable name may be changed from here, but warnings are displayed |
| Diagram 1004 | If more than one diagram is defined for an entity, this field contains the view name for the diagram which is considered the primary definition location for the variable. Nodes for a single variable may be displayed on more than one diagram for a variable. |
| Type 1006 | The variable type: Flow, Auxiliary, Stock, Constant, Data. If this is changed, the format of the dialog box will be changed as needed. Some changes are not allowed here. |
| Units 1008 | Units of measure specifications are required for all variables (dimensionless is allowed). The platform compiler and simulator rely on and check the validity of equations. (Oranges cannot flow into an apple inventory) |

TABLE 6-continued

| Control Item | Description |
| --- | --- |
| Min-Max - Incr. 1010 | These are optional settings that can be used control slider bars on an interactive user interface or to perform value checking during simulation. |
| From-To 1012 | The "From" and "To" boxes are specific to flows. They show the names of the stock variables that are the source and destination for the flow. |
| Equation text 1014 | The equation text field can be expanded to hold very large expressions, if necessary. It supports context sensitive auto-completion that begins without any entry. The initial list of items contains the causal inputs that have been established in the diagrams. Operators and punctuation are available when they are possible given the cursor position within the equation. If the cursor is immediately preceded by a variable name, the only options are operators and punctuation ("(", ",",")"). Equation text can also be the target of copy-and-paste or drag-and-drop operations. Other text may be inserted from keypad dialogs and from lists, such as the model structure tree |
| Comment 1016 | The comment field is expandable to accommodate lengthy references or citations. Rich Text format is supported to allow links, images, and format control. |
| Cancel 1018 | Exit without further change. Provides the option to undo any changes already made during the session. |
| Apply 1020 | Apply any changes made to this point, but leave the dialog open. Apply finalizes changes relative to Cancel. Changes are automatically when the user clicks outside of the field that was changed. These quick changes are immediately available to the compiler/simulator. |
| Add Alt 1022 | This functionality is described below. |
| OK 1024 | Apply any changes made and exit the dialog. |

Figure 11:
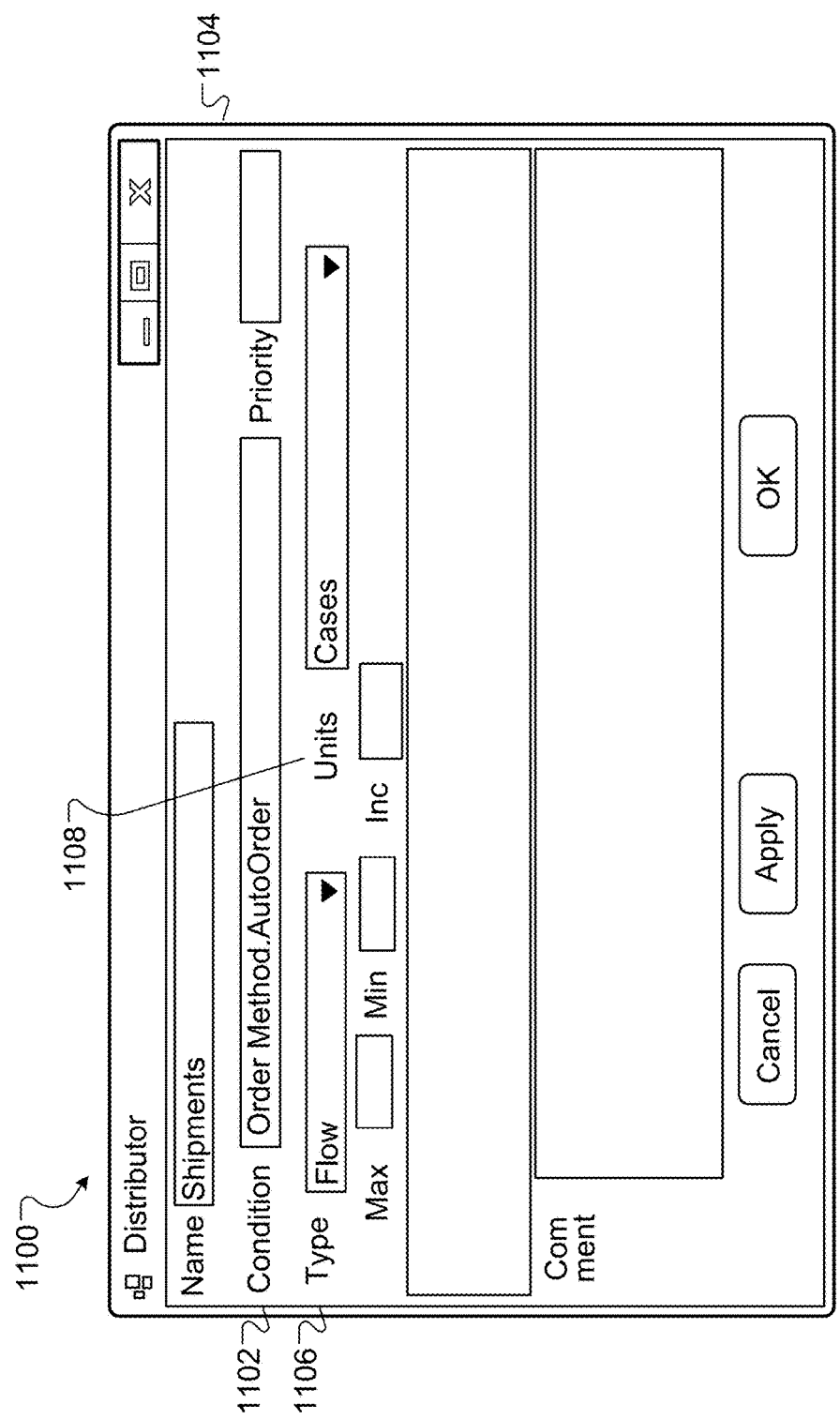

The add alternate equation functionality creates an additional equation for the variable that depends on the state of one or more attributes at the time the equation is needed. Referring to FIG. 11, an equation editor window 1100 enables alternate equations to be created, modified, or viewed. The Equation Editor window 1100 may include one or more of the control items listed in Table 7.

TABLE 7

| Control Item | Description |
| --- | --- |
| Condition 1102 | Conditions under which the equation may be used. |
| Priority 1104 | The sequence in which conditions are applied. Mutually exclusive conditions, such as different values for the same attribute, do not need to have different priorities. |
| Type 1106 | Occasionally, some entities may use a different type of equation than the main definition. This is allowed even though it has implications for diagrams and causal relationships. Validation is required. |
| Units 1108 | Units of measure may also be changed for certain entities. For example, if one of the entities uses a data forecast from an external source, the units might in barrels of oil versus a model that is calculating gallons for the other variables. Even though conversion factors can be automatically applied by Ventity, the units selected will affect how the data is entered and viewed by the user. |

For instance, the equation editor 1100 shows an example alternate equation that is applied if the condition 1102 that the Distributor's Order Method is "AutoOrder" is satisfied. More complex logic can also be supported.

When more than one alternate equation is provided, it is possible that the Condition may be satisfied for multiple equations. In some examples, alternate equations can be evaluated in priority sequence and the equation whose condition is satisfied first can be used.

Alternate equations may be loaded from data sets during model initialization. This capability can be used to support logic that is particular to specific uses of a generic model. Alternate equations can also be used for specific scenarios or test cases. Alternate equations provide a method for implementing Reality Check™ equations, by conditionally over-riding elements of model structure, such as described in U.S. Pat. No. 5,446,652, the contents of which are incorporated herein by reference in their entirety. This approach may in some cases be more convenient than adding switch variables that turn features on and off.

In some examples, alternate equations are linked to entities prior to the start of simulation execution. This reduces a potential performance drag in large models.

Figure 12:
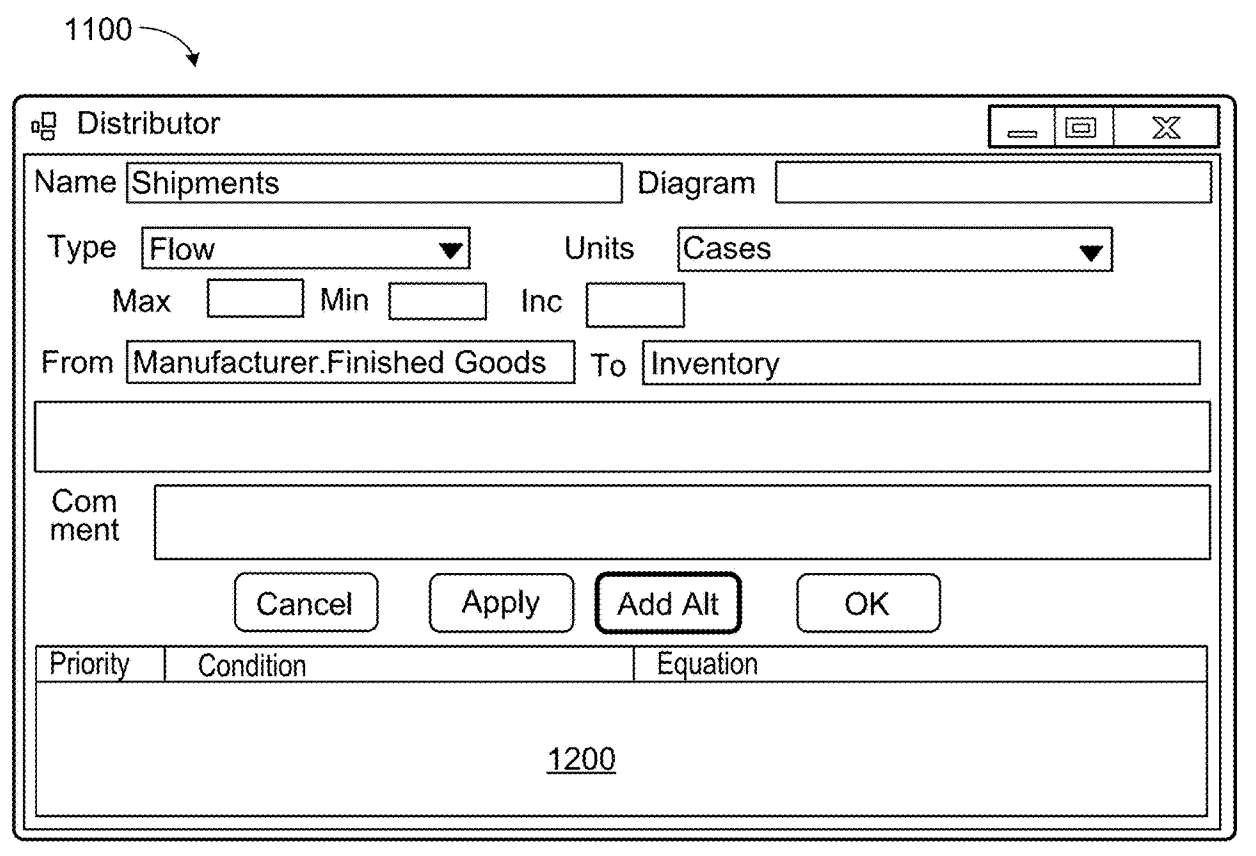

Referring to FIG. 12, when alternate equations are used, the main equation editor screen 1100 remains open and also displays a grid 1200 that can list the alternate equations with their associated conditions and priority. This list is used to access these equations for subsequent review or maintenance. The user can select conditions to modify or delete.

Collections

In some implementations, the platform can automatically form a collection that includes all of the entities of a particular type. Aggregate values can be accessed for each collection. The simplest aggregate is the COUNT of the number of items in the collection. For each variable in the collection's entity type, the user can access one or more of a MIN, MAX, MEAN, MEDIAN, STDEV, SUM, or PRODUCT value of a variable belonging to the entities in the collection, or a combination of any two or more of these aggregate functions. These functions can be accessible to the model builder without defining separate variables to contain them. Collections can also be referenced as a sub-divided array or sub-collection, where each sub-collection contains entities that have attribute values matching the attributes used to define the sub-collection. The processing to support these references is also automatic. An "ENABLED" attribute may be added that causes collections to automatically exclude entities that have been disabled. For example, if a business entity ceases to exist during model execution, the business entity will be disabled and its information will not be included in any collection.

Entities can be members in different types of collections, as determined by their attributes. For instance, a restaurant entity can belong to collections of Boston businesses, franchise restaurants, Back Bay restaurants, and owner-operated restaurants. Each of these collections can be used in equations or conditional logic. In some models, overall system behavior can be driven by emergent patterns in collection size, collection characteristics, or both.

In some implementations, during simulation, the platform can calculate only aggregate values that are used in equations. All other aggregates are generated as needed during subsequent analysis of the results. Accesses to these collections use indices and hash table lookups to boost performance.

Collections can be managed by the platform for processing efficiency, to promote easy and correct usage, or both. The platform can provide the ability to define two kinds of collections that are based on the automatic collections.

A user may establish sub-collections that are subsets of full collections whose membership is defined using specific value combinations of attributes. The sub-collection definition contains the attributes that are to be applied. This yields a matrix of sub-collections that can grow large combinatorially. The platform can mitigate the impact of this large and growing matrix on computation speed by only allocating space and performing calculations on an as-needed basis.

When an entity type definition is included in other entity type definitions, a "super-collection" can automatically be formed that contains all of the entities from all of the entity types. This super-collection uses common variables and attributes that are shared by all of the individual entities (and their entity types). For example, if entity types MANUFACTURER, RETAILER, and RESTAURANT all include BUSINESS in their definition, the aggregate functions for business may be used on any of the common fields. If BUSINESS includes EMPLOYER in its definition and CITYGOV and STATEGOV also include EMPLOYER, then all of the covered entities are included in aggregates such as Number of Employees and Average Salary. This capability mimics some object oriented programming concepts as inheritance, interfaces, and virtual methods.

Figure 13:
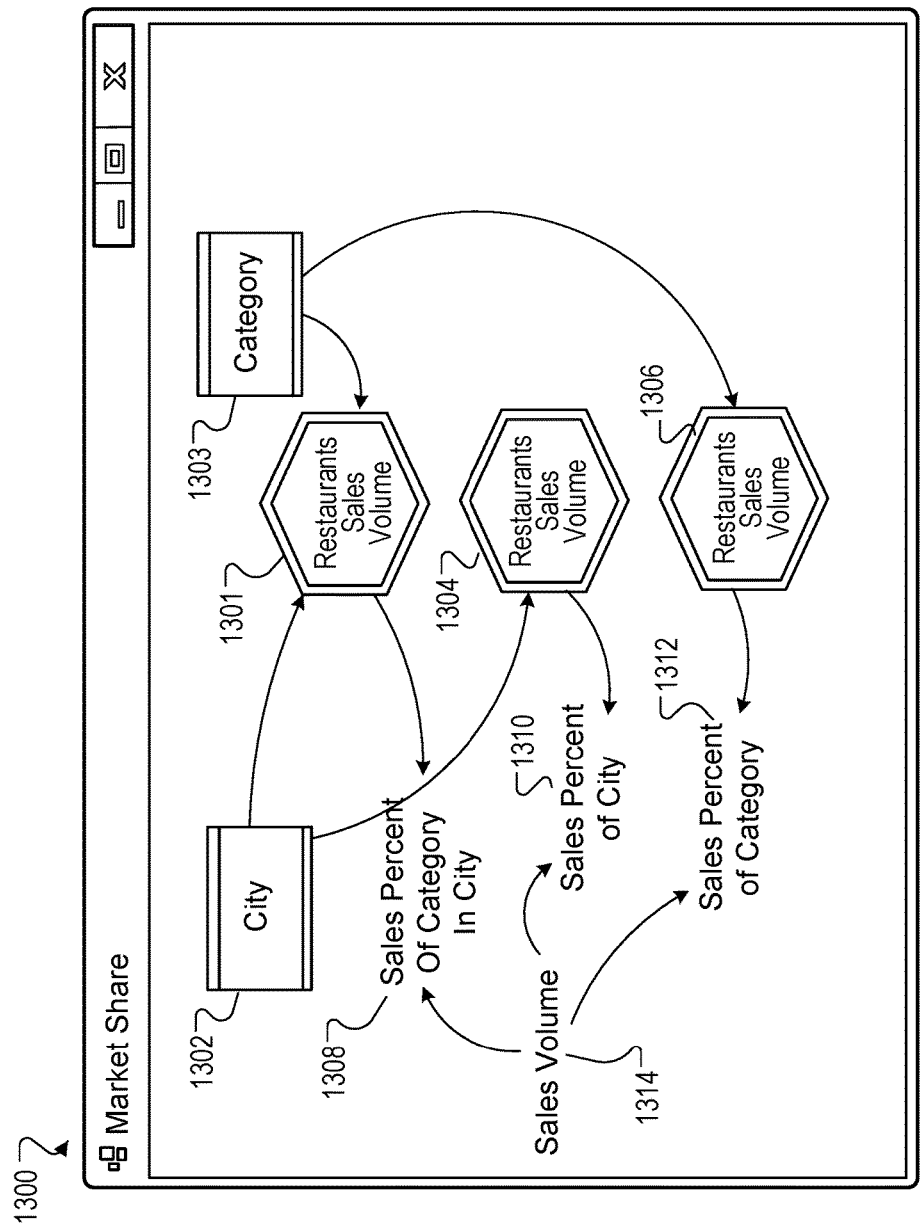
FIGS. 13-15 are diagrams of entity definitions.

Referring to FIG. 13, a diagram 1300 shows an example of how an entity model can use a collection. The collection in this example is Restaurants. The diagram context is part of an entity type definition for a restaurant. Three different Sales Volume entities are referenced: (1) All restaurants 1301 from the same city 1302 and category 1303, (2) All restaurants 1304 from the same city 1302, and (3) all restaurants 1306 from the same category 1303. Equations can be established for three variables (Sales Percent of Category in City (1308), Sales Percent of City (1310), and Sales Percent of Category (1312)) in terms of a Sales Volume variable 1314 and to variables in one or more of the three Sales Volume entities 1302, 1304, 1306.

An equation for the first variable 1308, Sales Percent of Category in City, can be written as follows:

Sales Percent of Category in City=Sales Volume/ SUM(Restaurants[City, Category]·Sales Volume)

Alternate formats and abbreviations can also be supported. In some implementations, if no aggregate function is entered, SUM is assumed. For instance, two example alternate formats are as follows:

Sales Volume/Restaurants[City, Category]·Sales Volume·SUM

Sales Volume/Restaurants[City, Category]·Sales Volume

Relationship Entities

Relationship entities can be used to model a relationship among two or more other entities. The relationship entity can contain attribute variables that identify specific entities or collections of entities. Stock and attribute variables can control the relationship logic and may also be used to store relationship history or status.

Lists of relationship entities can support efficient storage of relationships when entities may have relationships with multiple entities of a particular type but where the "array" or network of relationships is sparsely populated. As a result, relationships can be stored efficiently even as the number of entities becomes very large. In some examples, relationships may involve two entities of the same type (e.g. task to task precedence) and may sometimes include more than two entities.

Figure 14:
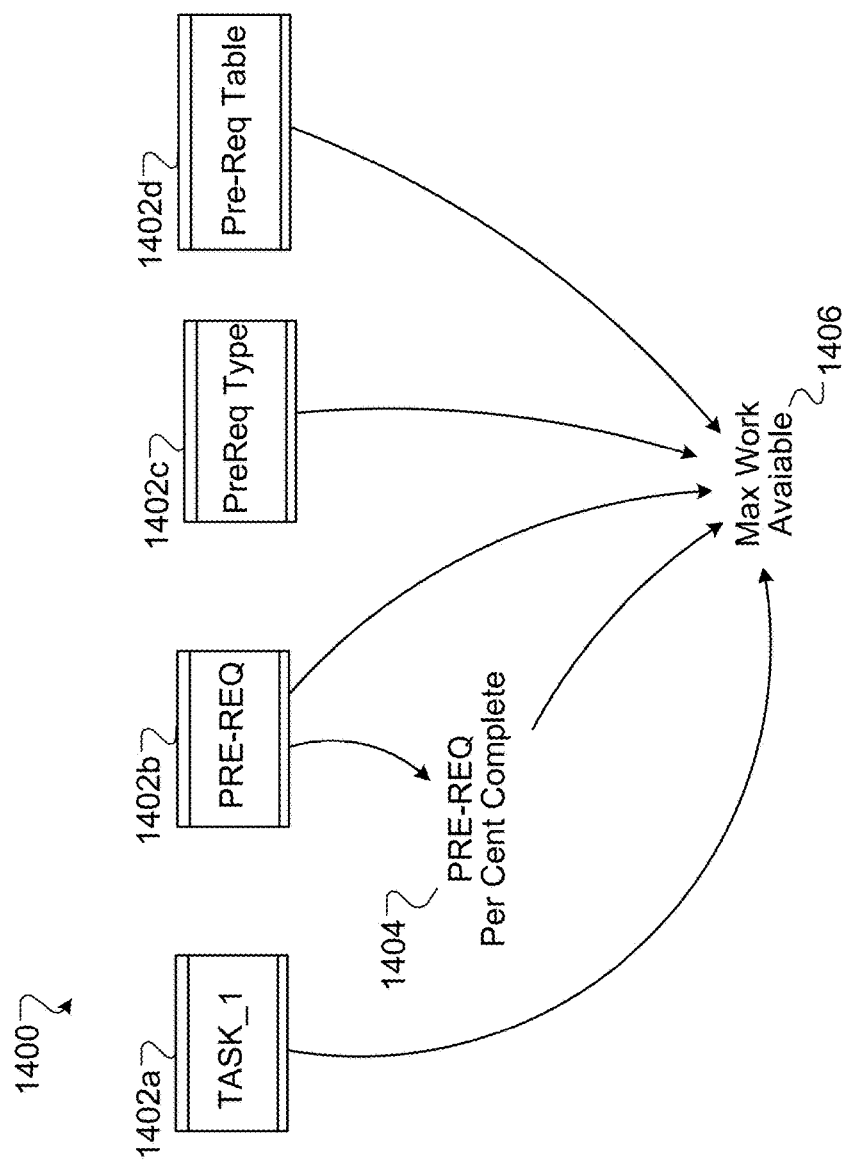

Referring to FIG. 14, a diagram 1400 represents an approach to implement a project Pre-Requisite structure using entities for an example of a task completion system. Project pre-requisites are commonly specified in project management planning. The diagram 1400 shows a number of attributes 1402 and their relationships with the variables PRE-REQ.Percent Complete 1404 and Max Work Available 1406. The attributes and variables shown in the diagram 1400 are described in Table 8.

TABLE 8

| Variable/Attribute | Description |
| --- | --- |
| TASK_1 1402a | An attribute that identifies a main task |
| PRE-REQ 1402b | An attribute that identifies a pre-requisite task |
| PRE-REQ.Per Cent Complete 1404 | A variable that indicates the percent complete for the task identified by the PRE-REQ attribute 1402b. |
| PreReq Type 1402c | An attribute that defines the type of relationship. Common relationships in CPM Project Management software may include, e.g., "FS", "FF", "SS", "SF", and other types of relationships. FS means that the pre-requisite task must finish before the next task can start. Alternate equations for Max Work Available 1406 can apply these rules in determining whether work can be performed. A PreReq Type of table would use the next attribute to invoke a lookup function. |
| Pre-Req Table 1402d | An attribute that contains the name of a table function that defines a more complex relationship between the two tasks TASK_1 1402a and PRE_REQ 1402b. An input value (in this case PRE-REQ. Per Cent Complete 1404) is used to look-up an output value (Max Work Available 1406). The platform can provide lookup table functionality, for instance, similar to the lookup table functionality that is provided by Vensim ®. |

TABLE 8-continued

| Variable/Attribute | Description |
| --- | --- |
| Max Work Available 1406 | A variable that indicates the maximum amount of work available for TASK_1 1402a, as determined by this pre-requisite definition. Note that other pre-requisites may yield a lower number. Thus, the Max Work Available variable 1406 belongs to the pre-requisite entity and not directly to the Task. The task value for Max Work Available 1406 is based on the minimum value from any of its pre-requisites. |

Relationship entities in the platform can have active variables whose values can change during the simulation. These values are stored in the model results.

In some implementations, the task pre-requisite relationships are static information established by the project definition. In some implementations, relationship entities can model dynamic relationships. One example of a model of a dynamic relationship is a Loan Default Analysis model that has a relationship record for each Customer-Loan combination, as shown in Table 9.

TABLE 9

| CustomerID | LoanID | LoanType | Balance | MonthlyPayment | LTV Ratio | City |
| --- | --- | --- | --- | --- | --- | --- |

In Table 9, CustomerID is an attribute that links to a Customer entity to get credit rating, income, age, or other factors that may influence a loan default of a customer associated with the particular CustomerID. LoanID is a unique identifier for a Loan entity. City is an attribute linked to a City entity having tax rate, unemployment rate, or other information. LoanType, Balance, MonthlyPayment, and LTV Ratio are attributes that describe the particular loan associated with the CustomerID and LoanID.

In some implementations, models can have many more fields and more entities.

In some implementations, relationships with certain generic properties can be established. For example, each grid cell in a 2-dimensional space, as in a Geographic Information System, is related to its adjacent neighbors. Web sites are related to other web sites in a Small World network. Topologies, such as a two-dimensional grid, a ring, a small-world network, or another type of topology, can provide an easy method for initializing relationship entities that establish such properties. In large models, the establishment of relationships with generic properties can be supported by specially implemented functions that are designed specifically to solve this type of problem efficiently.

Actions

Actions are model components that can provide support for certain discrete event and agent-based capabilities within the context of a continuous dynamic model. Actions can be used to package transactions or flows that occur together so that an internally consistent change of the multiple states or stocks can occur; for example, double entry bookkeeping in a financial model. Action definitions can be assigned to a particular entity type, but the action is not necessarily limited to the parent entity and may even create or delete entities. Actions can simulate a wide range of operations such as creating new entities, making an investment, placing an order, finding oil, or other operations.

During simulation, all appropriate calculations are processed for every active entity. Actions are only processed when scheduled or invoked by other actions. The scheduled execution time for an action may be any explicit time during the simulation. Actions may also be scheduled to be processed at the beginning or end or every time period.

A new action can be defined by adding an action to an existing entity. The properties for the action can be accessible through a dialog. The properties can include one or more of the following properties:

Schedule: Immediate, Start of Period, End of Period, Scheduled time, On Create

Conditions: Logical expressions that determine whether the Action is executed

New Entity Type: If an entity is to be created

Figure 15:
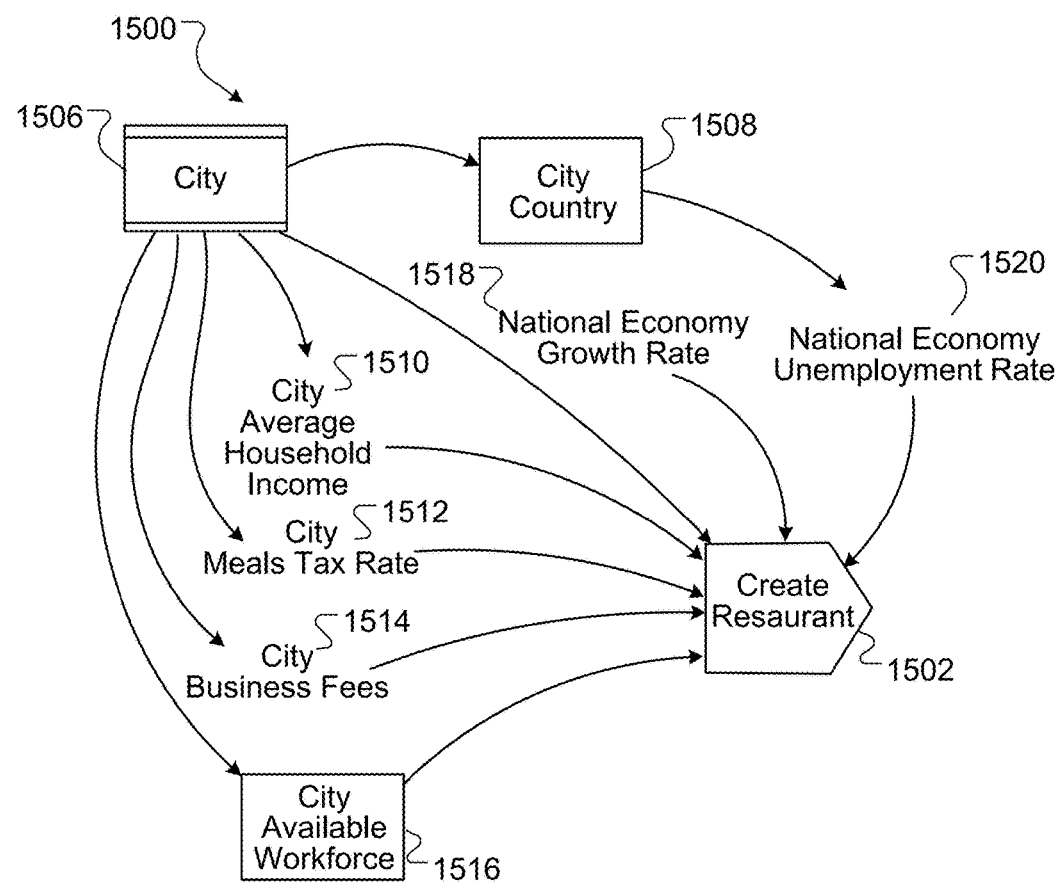

Number to Create:

Action Name:

Referring to FIG. 15, an example diagram 1500 includes a "Create Restaurant" action 1502 that executes an action to determine whether a new restaurant should be created given the value of certain variables linked to the action. The "Create Restaurant" action 1502 is part of a new growth entity represented by the diagram 1500 that includes "City" 1506 as an attribute. The diagram 1500 also shows a number of variables and other attributes described in Table 10.

TABLE 10

| Variable/Attribute | Description |
| --- | --- |
| City 1506 | An attribute that identifies the city and is used to connect to the desired City entity |
| City.Country 1508 | An attribute from the City entity that identifies the country where the city is located |
| City.Average Household Income 1510 | A variable that indicates the average household income from the City entity. |
| Cityl.Meals Tax Rate 1512 | A variable that indicates the meal tax rate from the City entity |
| City.Business Fees 1514 | A variable that indicates business fees from the City entity. |
| City.Available Workforce 1516 | An attribute from the City entity that identifies the available workforce in the city. |
| National Economy.Growth Rate 1518 | A variable that indicates growth rate values from the National Economy entity |
| National Economy.Unemployment Rate 1520 | A variable that indicates unemployment rate values from the National Economy entity. |

Once an action node is placed on a diagram, a user can add links to the action node from any variables that are used in the conditional statement associated with the action node. Once the links are established, any attributes or variables from related entities may be used to execute the action (e.g., to decide whether to create new restaurants). Attributes and variables can also used to initialize the attributes and stock variables in newly created entities.

Figure 16:
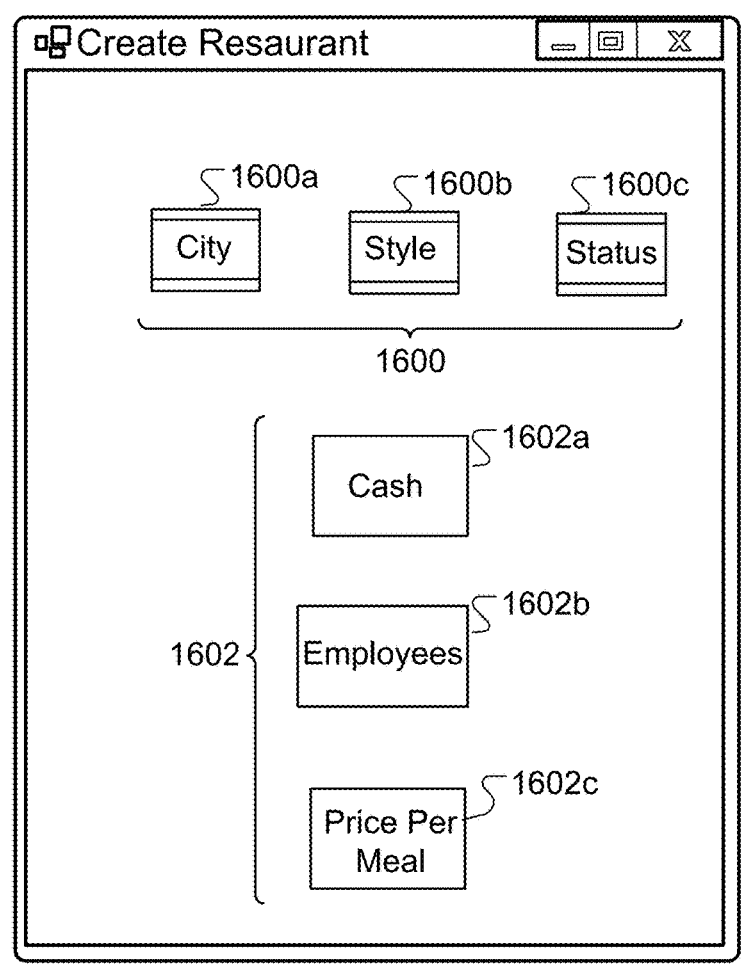
FIG. 16 is a diagram of attributes and variables.

The action can be defined using a separate diagram. If the action type is "Create Entity", the diagram can be pre-populated with variables to be initialized (e.g., stock and attributes). The initial stocks for the new entity are calculated by user direct equations rather than by flows. The user may add variables to an action to calculate intermediate values. For instance, referring to FIG. 16, nodes represent relevant attributes 1600 and variables 1602 that may need to be initialized to create a new restaurant entity. The attributes 1600 and variables 1602 are described in Table 11.

TABLE 11

| Variable/Attribute | Description |
| --- | --- |
| City 1600a | An attribute that identifies the city |
| Style 1600b | An attribute that identifies the style of restaurant |
| Status 1600c | An attribute that identifies the restaurant as New, Active, Closed |
| Cash 1602a | A variable that indicates the cash balance for the business |
| Employees 1602b | A variable that indicates the number of employees |
| Price Per Meal 1602c | A variable that indicates the average price per meal |

In this example, the City attribute can be initialized from the entity from which the Action was invoked. The invoking action is able to set initial values for attributes and stocks using available values or calculations. Distribution functions (e.g., random number driven distribution functions or deterministic allocations) can be used to establish the initial values.

In some examples, in addition to a "Create Entity" action, another step may be involved for a new entity. An entity type may have an action that is automatically executed each time a new entity of that type is created. This action is optional and may be used to ensure that all stocks and attributes have acceptable initial values. For instance, an "On Create" action can be useful for entities loaded from databases or other external sources that may be missing critical information. These actions can use conditional logic to determine which variables need additional calculation.

Entity creation is often modeled using probabilistic functions that are based on statistical distributions. For some modeling problems, it may be adequate to base these actions on distributions and probabilities established when the model is built or when data is provided. For entities created dynamically during a simulation, initial attributes may be assigned from dynamically updated distributions of its contemporary population of like entities (maintained and managed by the collection representing the active populations of respective entity types). The platform provides the option to use distributions calculated from collections so that newly created entities can be based on the best (e.g., most accurate, most up-to-date, etc.) information at that point in time. These capabilities can be implemented as built-in functions.

In some implementations, two steps can be involved in processing a transaction—establishing the transaction and then executing all of the equations and other actions in the transaction. The setup takes place when the transaction is created. The execution takes place at the scheduled time.

Actions can delete or disable existing entities. In some implementations, entities are logically deleted from the active system structure but may not be physically deleted from memory. Thus, the deleted entities may remain available for reference if the model uses look back logic to refer to past values of variables. Create and delete functionality may be combined in one action to merge existing entities or to split an entity into multiple entities.

Actions can also be linked to changes in entity information to update relationships and attribute settings.

Sub-models can be defined that run with their own time frames and are somewhat separate from the primary model. One category of sub-model periodically generates forecasts based on the state of the main model. These forecasts are then used to make decisions in the main model. Such sub-models may be invoked by an action. The action sets the time horizon and input values for the sub-model. The sub-model runs as part of the action. The results can be immediately available.

Team Modeling Support

A typical model is generally atomic, meaning that there is just one computer file that contains the model. In practical terms, this can be a severe restriction on the number of people who can productively collaborate to develop and use a model, and hence a restriction on the scope of problems addressable by a simulation analysis. The platform provides strong support for modular development of models to enable collaboration among multiple users or groups of users.

In the platform, each entity type definition may be stored separately from all other entity type definitions, for instance, in an XML file, in a multi-user database table, or in another type of data storage. Entity type definitions can be connected to other entity type definitions through names. This structure can allow the development and use of alternate structures by replacement and the ability to provide templates that individual users or groups of users can "fill-in". For instance, this modularity can minimize the difficulty of keeping multiple development groups "in sync".

In some implementations, model executions can include data tables that initialize some or all of the entities for a model. These data tables may be modified or replaced by any stakeholder, "expert", or observer with access to the model. Furthermore, all of the logic can be transparent (with the exception of user-compiled functions, discussed in greater detail below). Multiple groups can make changes to the same entity as part of model analysis and experimentation.

In some implementations, the platform, or an external source control system supporting the platform, can keep version history of the model used to generate specific scenarios, so that backing up and analysis are possible.

The concentration of entity logic in a small number of diagrams can make it easier for non-modeler subject matter experts to review and contribute to model logic. Interested observers (with proper access, of course) can include alternate equations as part of scenario definition.

As an example, we consider the implementation of the C-ROADS model (http://climateinteractive.org/simulations/C-ROADS) using the platform. C-ROADS is a model that translates country emissions commitments into global climate outcomes. There are several challenges involved in construction of this model:

1. Country-level emissions are to be aggregated to varying, possibly overlapping, regional levels
2. Decision input can be desired in different modes; executing code for modes of entry that are inactive can be wasteful 3. Scenario input may be made at varying levels of aggregation
4. Multiple team members can manage different portions of the model, but the model is to be run in its entirety
5. Quality control can involve testing of subsystems in isolation.
6. The model can involve both simple user interfaces, for internet clients and educational users, and sophisticated algorithms for calibration and power users.
7. Building confidence among users, including decision makers, involves transparency, including, e.g., high visibility of data and structure.

The platform can provide solutions to these issues. The implementation of the C-ROADS model using the platform can look and work as follows.

Figure 17:
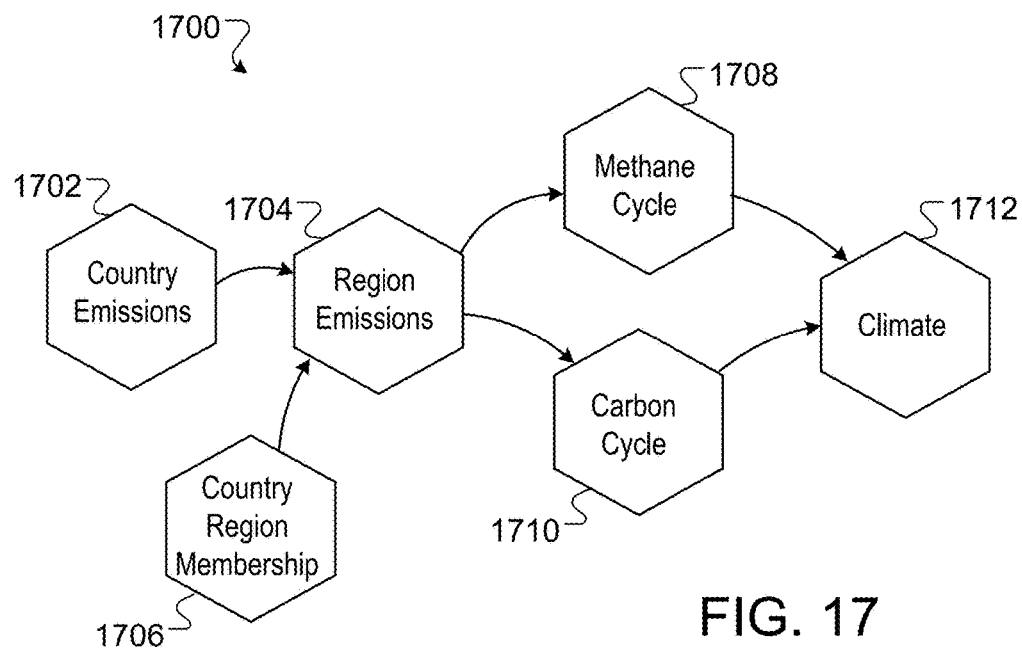
FIG. 17 is a diagram of an entity definition.

Referring to FIG. 17, the C-ROADS model can become a top-level entity type definition (ETD) 1700. The C-ROADS ETD can contain other ETDs that organize the structure of the model and facilitate reuse. For instance, in the example shown, the C-ROADS entity contains a country emissions entity 1702, a region emissions entity 1704, a country region membership entity 1706, a methane cycle entity 1708, a carbon cycle entity 1710, a climate entity 1712. Other entities can also be contained in the C-ROADS entity 1700. Relationships among constituent entities are shown as arrows. The top-level C-ROADS model entity can also contain data, variables, or both (not shown).

Team members can begin to assemble the model by first creating the relevant ETDs, which contain attributes and key variables that cross entity boundaries, but which lack internal dynamics. The construction of entities can then proceed in parallel, with individual team members or groups of team members taking responsibility for particular entities, and populating the entities with stocks, flows, data, etc. as appropriate to yield an executable model.

Figure 18:
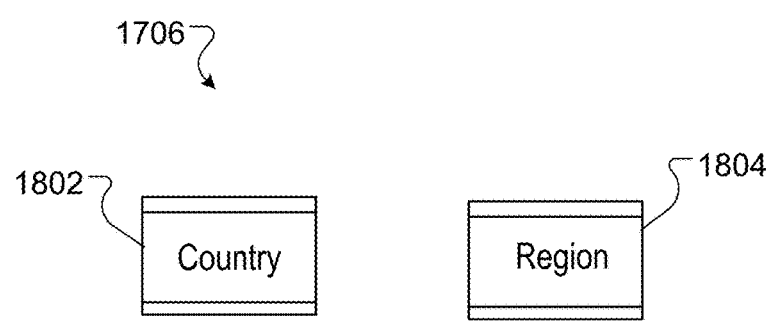
FIG. 18 is a diagram of attributes in a relationship entity.

Countries and regions can be designated as entities. For instance, referring to FIG. 18, the relationship entity, country region membership 1706, contains a mapping between country attributes 1802 and region attributes 1804. Because countries may belong to more than one region, there may be multiple instances of the country region membership entity 1706 for a given country. For example, USA (the country) can belong to three regions: North America, OECD, and Global.

Using the country attributes 1802 and the region attributes 1804 that describe region-country relationships, country emissions can be aggregated to determine regional emissions (addressing challenge 1 in the list above) and regional decisions can be propagated to countries (addressing challenge 3 in the list above).

To add a new country or region to the model, a user can supply data to initialize the new entity and to update the attributes in the country region membership entity 1706 that map countries and regions.

Figure 19A:
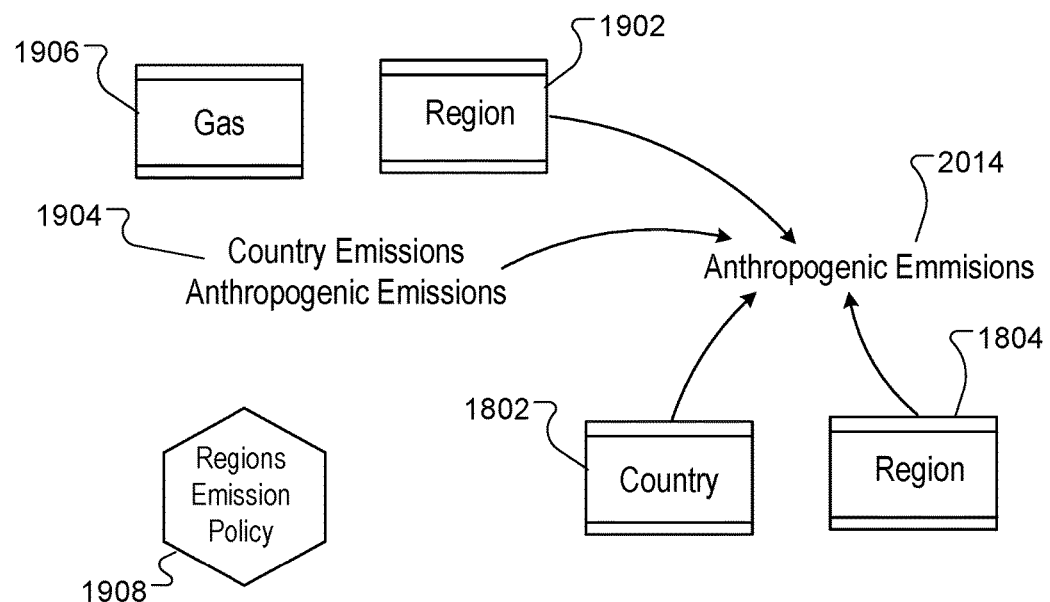
FIGS. 19A and 19B are diagrams of an entity definition.

Referring to FIG. 19A, the region emissions entity 1704 uses the country attributes 1802 and the region attributes 1804 of the country region membership relationship entity 1706 (not shown) to aggregate country anthropogenic emissions 1904 to determine regional anthropogenic emissions 2014 for a particular region 1902. The region emissions entity 1704 contains a Gas attribute 1906, with members such as CO2, methane, N2O, etc., so that the same entity type may be used to aggregate emissions of each distinct greenhouse gas, without writing any additional equations.

Figure 19B:
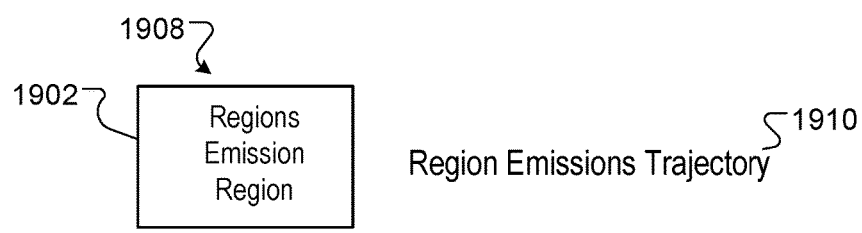

In addition, referring also to FIG. 19B, the region emissions entity 1704 for the particular region 1902 may contain a region emissions policy 1908, which defines an emissions trajectory 1910 at a regional rather than country level (e.g., as a European Union policy might apply to member countries). The region emissions policy entity 1908 acquires an attribute, region 1902, from its parent, and defines a region emissions trajectory 1910 (ordinarily this variable would have complex dynamics, but we do not elaborate upon its structure here).

Figure 20:
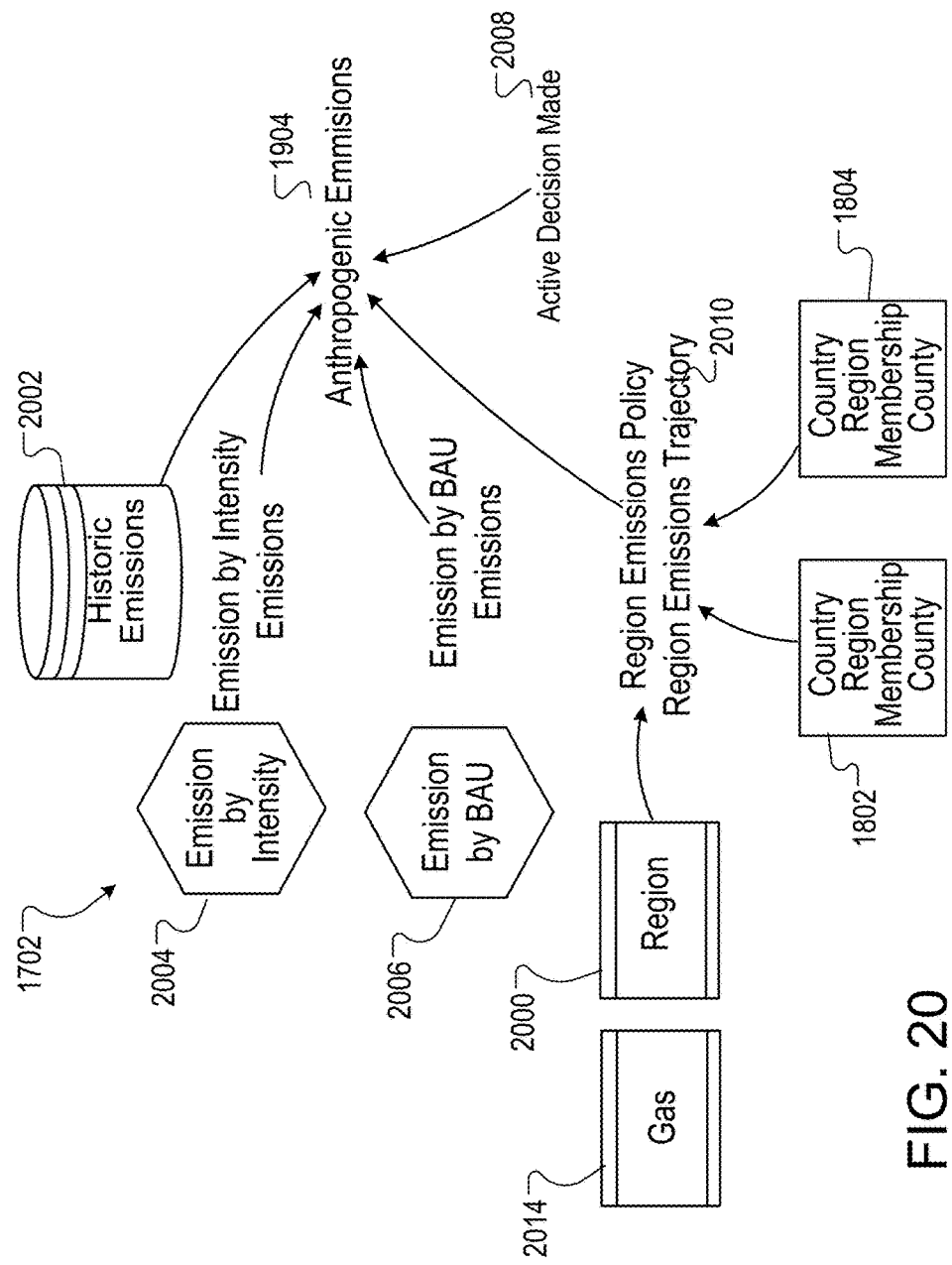
FIGS. 20-21 are diagrams of entity definitions

Referring to FIG. 20, the country emissions entity 1702 generates country anthropogenic emissions scenarios 1904 for a particular country 2000. It combines data about historic emissions (e.g., obtained from an emissions database 2002) with future scenarios generated by different methods. Two methods, emissions by intensity 2004 and emissions by BAU (business as usual) 2006, can be calculated within entities that are members of the country entity 1702. Depending on the active decision mode 2008 (a variable switch), it may not be necessary to create both the emissions by intensity 2004 and the emissions by BAU 2006 entities, saving computation time if only one mode is needed (addressing challenge 2 in the list above).

A third method derives country emissions from regional policy, using the region emissions trajectory 2010 from the regional emissions policy entity 1908 owned by an associated region emissions entity 1704. As in the region emissions entity 1704, the country region membership relationship entities 1802, 1804 are used to determine which regional policy is mapped to a given country.

Like the region emissions entity type 1704, the country emissions entity type 1702 contains a gas attribute 2014, so that the same structure may be used for each distinct greenhouse gas, without writing any additional equations.

Once country emissions have been calculated, and aggregated to regions, including global, the global biogeochemical cycles may be calculated.

Figure 21:
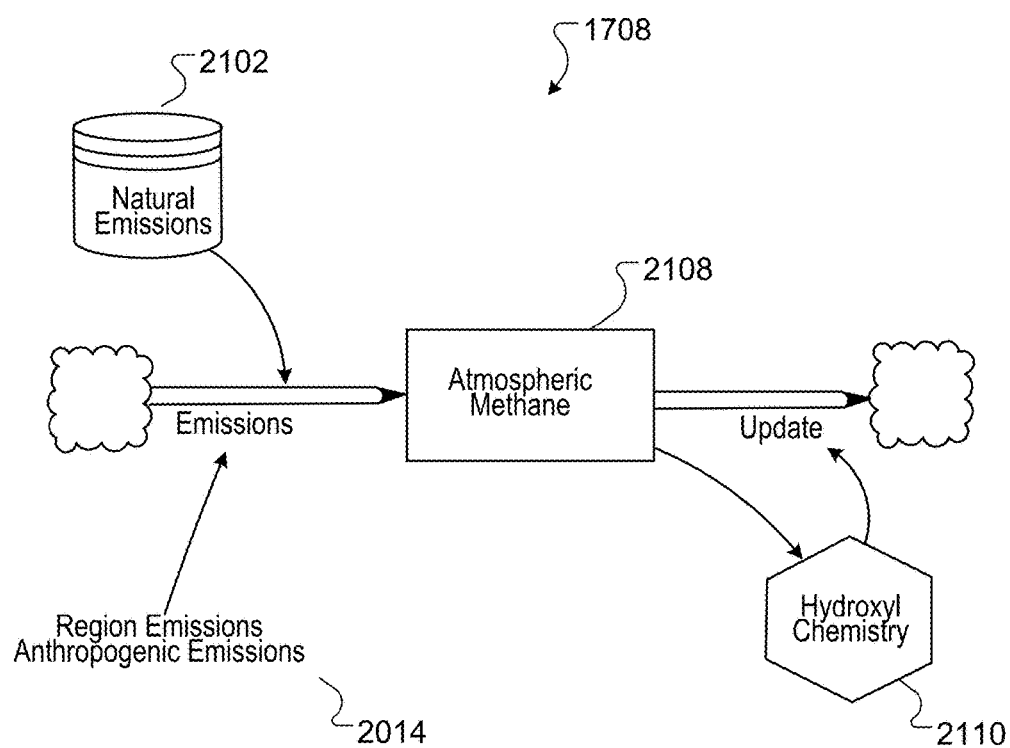

Referring to FIG. 21, the methane cycle entity 1708 takes natural emissions 2102 from a data source and combines them with regional anthropogenic emissions 2014. Since only global emissions are involved in driving the methane cycle, the methane cycle entity 1708 refers to Region Emissions.Anthropogenic Emissions 2014 for global methane. The methane cycle entity 1708 then computes the dynamics of atmospheric methane 2108. For visual simplicity and organization, the complexities of atmospheric chemistry that govern the variable atmospheric lifetime of methane are collapsed into a hydroxyl chemistry group 2110.

The methane cycle entity 1708, like other ETDs in the model, may be stored separately, facilitating version control and collaboration (addressing challenge 4 in the list above) via file-based synchronization and version control systems, or via storage of the entity and its history in a multiuser database. This approach can, for instance, permit a person with relevant biogeophysical expertise to maintain the methane cycle entity 1708, while other team members with economic or political expertise maintain country 1702 and region 1704 emissions entities.

The methane cycle entity 1708 may be run in isolation from the remainder of the model. This permits extreme conditions or equilibrium testing, unencumbered by the overhead of executing the remainder of the model. It also permits rapid execution for automated recalibration of parameters within the hydroxyl chemistry group 2110, in response to new data or structural changes to the model.

Assembly of other portions of the model, like the climate ETD 1712, can proceed using similar concepts as those described for the methane cycle entity 1708. Once the model is assembled, the platform can provide additional functionality supporting its use (addressing challenges 6 & 7 in the list above).

Significant effort can often be involved in maintaining data on historic country emissions, stated future policies, global atmospheric GHG concentrations, temperature, and other variables. These inputs can be maintained in a database (e.g., the emissions database 2002 shown in FIG. 20) or another data store, such as an XML file. The platform can provide easy connections to this data. In addition, the platform can store simulations in a file format that includes input data and parameters, so that runs from different versions of the model may be compared, revealing differences in inputs and outputs. This can be useful, e.g., for forecast verification, quality control, learning, or other applications.

Data preparation features of the platform may be of assistance where adjustments to units of measure (emissions from tons to gigatons), time (averaging of monthly temperature to an annual basis), or granularity (downscaling regional emissions to member countries, absent direct country data) are appropriate.

Users might use the model in several different contexts. Some example contexts are described as follows:

Gaming-simulation, where a group of users, e.g., assembled physically in a room or virtually over a network, plays through time in the simulation, making decisions at intervals and observing results. (e.g., similar to the approach used by World Climate, a role playing climate simulation designed by MIT and Climate Interactive) When puzzling outcomes arise, the facilitator, or other users, can browse the model structure to trace the puzzling outcome to its origins.

Strategy verification. When countries make statements about the effects of emissions policies on global climate, third parties may wish to verify those claims. In such cases, users can translate the statements about policy to parameter changes at various leverage points within the relevant country or region entities. The users can then simulate the model and observe the outcome. Often, the new outcome can be compared to a baseline or business-as-usual scenario to verify the claim. The platform can support this comparison through its run management features. Further, other parties may dispute the initial analysis. In those cases, the platform can permit other users to explore the structure of the model and to prepare alternate interpretations of the claim, using the initial analysis as a starting point.

Scenario attribution. When the model is used to evaluate many country policies simultaneously, as is often the case, it can be desirable to know how individual country initiatives contribute to the global outcome. This can involve multiple simulations of the model, omitting one country at a time, to identify the individual contributions as well as a nonlinear interaction term. The outcome of each experiment is then an ordinary variable, Global Temperature. The results for important scenarios can be plotted or otherwise displayed, allowing comparisons, variance calculations, or both, for scenarios such as "All countries" and "No US participation".

Probabilistic simulation. A variety of aspects of the climate system are uncertain, such as, e.g., future business-as-usual emissions, the effectiveness of policies, the sensitivity of climate to increases in radiative forcing from greenhouse gases, and other aspects of the climate system. Users who wish to make decisions with an appreciation for this uncertainty may want to conduct multiple Monte Carlo simulations, with parameters drawn from subjective probability distributions. This may be accomplished either through the embedding of a sub-model, as in the previous example, or through algorithms in the platform designed to exercise models for such purposes.

Realtime interactive simulation. An individual user may want to perform quick experiments with different emissions trajectories, e.g., in order to get a feel for the dynamics of the system. The model can support development of insight into the dynamics by executing quickly, so that changes to climate outcomes may be seen effectively instantaneously in response to changes in inputs specified by, for example, moving a slider or knob interface element controlling a parameter.

Model Definition Data Structures

In some implementations, model definitions can be presented to the user as diagrams, equation dialogs, or both. A variety of reference views can also be available. Each model can be defined in a data set that may be stored in a data structure, such as a database, an XML file, or another type of data structure. Multiple model definition data sets can be included together in a combined model. Connections can be resolved through text string matches, the use of a symbol table, or both. Table 12 lists some key tables and fields that support model definition.

TABLE 12

| Table | Important Fields | Comments |
| --- | --- | --- |
| EntityTypeList | EntityTypeName | The EntityTypeName connects information from all tables to a single entity type. This field is matched between most of the remaining tables. |
| | Category | Type of entity: entity or action. |
| Variables | EntityTypeName | The variables table contains a list of all the variables contained in an entity type definition. |
| | VariableName | The variable name is unique within each entity type definition. |
| | VariableType | Variable types such as stocks, flows, calculation types, data, or other variable types. |
| | Units | Units of measure, such as currency, size, or other units of measure. |
| | Equation | Text of the primary equation applied for this variable |

TABLE 12-continued

| Table | Important Fields | Comments |
| --- | --- | --- |
| Equations | EntityTypeName | The equations table contains alternate equations, if they exist. This table is used to support alternate equations for entities of the same type. The primary equations are stored in the Variables table. |
| | VariableName | Part of the key, matched with the variables table |
| | Priority | Determines the sequence in which alternate equation conditions are evaluated |
| | Condition | A logical expression applied using values from entities to determine which equation to use. These conditions are usually static and, if so, they are resolved at compile time. |
| | Equation | Text of the alternate equation for a specific variable and condition |
| Attributes | EntityTypeName | The attribute table lists the names of all attributes for an entity. |
| | AttributeName | The name of the attribute. |
| | BaseEntityName | All attributes values exist as key identifiers in a base entity that is used for fast lookup. Base entity tables can be created by the application if they are not explicitly defined by the user. |
| | IsPartOfKey | Indicates if the attribute is one of the attributes that identifies the entity as unique. |
| Actions | EntityTypeName | Actions are referenced as part of entities, but the variables, attributes, and views are stored as independent entity types. This is the name of the containing entity. |
| | ActionName | The action name is combined with the parent entity type name to form the entity type name for storing the action details: ENTITYTYPENAME:ActionName. |
| RelatedEntities | EntityTypeName | The related entities table stores information that allows entity equations to reference variables from other entities or collections of other entities. |
| | RelatedEntityType | The type of the entity or collection being referenced. |
| | RelationshipAlias | An optional abbreviation that can be used in equations. |
| | Condition | Logical condition to apply in selecting one or more entities. For single references, this condition will usually be the attribute that is the key identifier for the referenced entity. |
| | AllowMultiple | Indicates whether the relationship refers to a set of multiple entities or determines one specific entity |
| VGoViews | ViewNumber | View number is managed by the application to connect all the nodes and links to the appropriate diagram (view). This table also contains various diplay and format fields. |
| | EntityTypeName | The entity type to which the view applies. |
| | ViewName | A unique name within the list of views for an entity type. The default view name is the entity type Name. |
| VGoNodes | ViewNumber | Connects to the View table information. |
| | NodeID | A unique ID for each node or object in the view's diagram. |
| | NodeType | Node types include stock, flow, collection, etc. |
| | EntityTypeName | The entity type for the variable represented by the name - may be different than the entity type for the view. |
| | VariableName | The node name, which may be a variable, an action, a collection, or other node. |
| VGoLinks | ViewNumber | The Links Table contains information about the links that are on the view. These links include causes arrows and flow "pipes". The table includes detail information about connections, path, and formatting. |
| | LinkID | A unique ID used by the display software. |
| | LinkType | Indicates whether the item is a flow or an information link |

Model Run Management

Model run management is used to prepare simulations, execute the simulation, and keep track of simulation results. A model run is a single execution of the model using a particular version of the model, initial data, and simulation control parameters. Single model executions can be performed using interactive analysis, sensitivity analysis, uncertainty analysis, optimization, or another approach, or combinations of them, and may generate thousands of individual runs. All runs may be tracked by model run management. During model development and ongoing use, the modeler and users can compare the results achieved using various versions of the model and under various sets of assumptions.

The platform can maintain a run history log that keeps track of model definition version, data, scenario definitions, run control parameters, and other parameters. The platform can also maintain archived and compressed copies of each different version. In some implementations, the user can purge unwanted copies to reduce clutter and storage requirements. In some cases, such as for Monte Carlo analysis or another type of sensitivity analysis, a modeler may save only a few result variables per run.

The run history log maintained by the platform can contain enough information to support a model rerun that saves full detail from the run, enabling in-depth analysis of runs, e.g., runs with interesting or extreme summary results. Because prior versions of models and data are saved, it can also be possible to roll-back to a prior version of a model, e.g., if recent changes to the model have caused errors. New data can also be tried against older versions of the model. Changes to models can be tracked at the model definition, input data, assumptions, or run control levels, or at a combination of any two or more of these levels. In addition, the platform can provide difference reports to simplify the process of analyzing difference in results.

Simulation iterations can differ in one of more of the following ways:

- Model version differences, e.g., equation changes, additional variables or relationships, additional types of entities, or other model differences.
- External data changes, e.g., due to additional, revised, or more recent data updates.
- Changes in parameters or assumptions, e.g., alternative scenarios or changes generated during sensitivity, uncertainty analysis, optimization or other automated scenario generation algorithms.
- Simulation control instructions, e.g., simulation time frame or methodology or both, including advanced analysis techniques The model run management log can contain enough information to completely rerun a prior simulation in its original form or with more detailed output. The model run management log can also be used to analyze differences between runs and to roll back to an earlier version to of a model try the earlier version against more recent data. Model run difference analyses can be used in analysis to attempt to attribute behavioral changes to individual parameter or equation changes.

The platform allows a user to look at a small list of all sources (e.g., parameter groups, data sources, or both). Knowing the complete "recipe" for assembling a given simulation can allow the recipe to be changed easily and allows the user to avoid dealing with parameters en masse.

The platform can also allow the user to reproduce the model structure used for any given simulation, even in the midst of a long model editing session, allowing the user to determine structural differences between two given simulations and to easily undo unsuccessful changes to a model structure.

For models producing results at different stages of model development, the platform can allow a user to understand and experiment with some or all of the differences between an earlier model and a later model.

Data Preparation

For real world modeling, the platform can initialize the simulation using data from data sources such as databases, files, other simulations, other sources of data, or a combination of any two or more of these data sources. The platform removes information, structure, or both that are specific to a particular problem, system, or situation from the models and places that specific information or structure into data structures that are external to the model itself. This approach can support reusable models that drive applications with large numbers of independent users.

For many models, individual entities can be initialized from corporate or organizational databases. In order to create an entity, all attributes and stocks are given values. In some implementations, the platform supports initialize actions that set some variable initial values either based on calculations using other data or by applying random distribution functions. In some examples, this information can be provided in a data table with all of the fields, such as the example data table shown in Table 13:

TABLE 13

| Loan ID | LoanType | Balance | CustomerID | LTV Ratio | City | Payment |
| --- | --- | --- | --- | --- | --- | --- |

The type of table shown in Table 13 can be used to load initial values at a known time. In some implementations, only attributes, stocks, and constants need to be initialized.

A TimeStamp field can be used to load history or reported data for reporting purposes. The TimeStamped data can also be used to load exogenous forecasts. History and comparison values can be provided for auxiliary and flow variables, in addition to stocks and attributes. Some attributes are used for identification purposes, and partial history and forecasts can also be used.

TimeStamped information can also be used to initialize model starting data for a model that is run on a regular basis and which uses information derived from business or organizational databases. An example table including a TimeStamp field is shown in Table 14.

TABLE 14

| TimeStamp | Loan ID | LoanType | Balance | CustomerID | LTV Ratio | City | Payment |
| --- | --- | --- | --- | --- | --- | --- | --- |

In some implementations, the platform can support models that involve very large numbers of entities. Regardless of the data source, each entity definition includes the attributes and equations that describe its dynamic behavior. For each type of entity, there may be multiple distribution profiles that are segmented according to system components or the scenarios being studied. The platform can provide support for applying alternative profiles and for calibrating and analyzing simulated behaviors.

Entity type definitions may also include initialization equations that are applied whenever an entity is created. Entity initialization data sets may include equations or model structures that are specific to individual entities or sub-categories of entities. In some implementations, complex modeling projects may use many separate data sets in combination with each other to streamline analysis.

Figure 22:
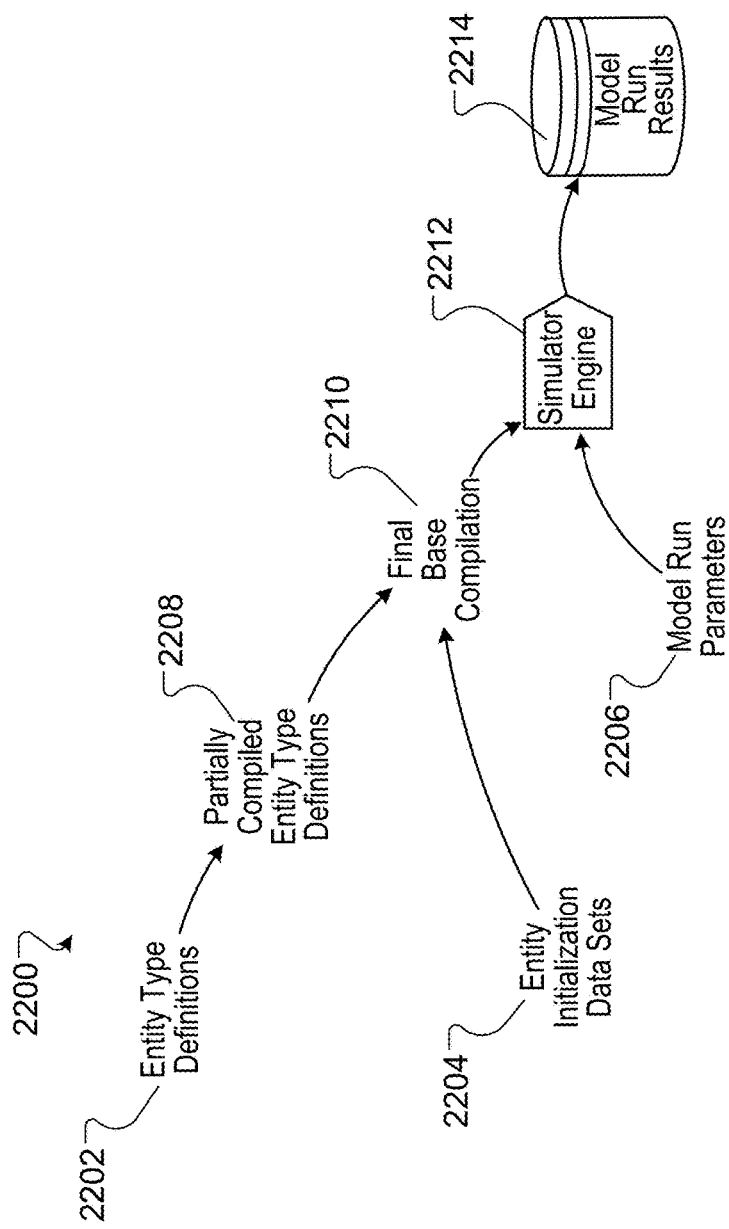
FIG. 22 is a block diagram of the compilation and execution of a model.

In many practical modeling cases, external data can be processed in order to be useful for driving model behavior or for comparison and calibration of model output. In some implementations, the platform can provide tools to permit the user to accomplish common transformations easily. For instance, these tools may include one or more of the following tools:

Adjustment of the time axis
    Converting quarterly data to decimal years, e.g., Q2 2012=2012.5
    Aggregating monthly data to match annual reporting in a model. Typically this different treatments are used for quantities that are stocks (which are averaged) or flows (which may be summed and adjusted for the change in time units)
    Re-centering intervals to account for reporting at the beginning, middle or end of periods
Interpolation and extrapolation
    Interpolation of missing data points
    Looking ahead or backward to an appropriate data point
    Extrapolation of data beyond the time interval available
Change of units
    Conversion of flows from one time base to another (as when aggregating monthly data to annual, above)
    Conversion from English to Metric units
Integration or differentiation
Aggregation or allocation
    Summation of sales by product into total sales
    Allocation of aggregate data (total staff) into disaggregate categories matching the granularity of entities (staff by department), using constant fractional attribution or some other algorithm Run Preparation Referring to FIG. 22, in a general approach 2200 to run a model, the platform uses the model definition (i.e., all of the entity types for each entity type definition 2202 of the model, including collections and actions), initial data sets 2204, and simulation control parameters 2206 (also referred to as model run parameters), such as start time, end time, and simulation interval. Individual runs may be started interactively or scheduled for a specific time, perhaps when some updated operational data is available.

Figure 23:
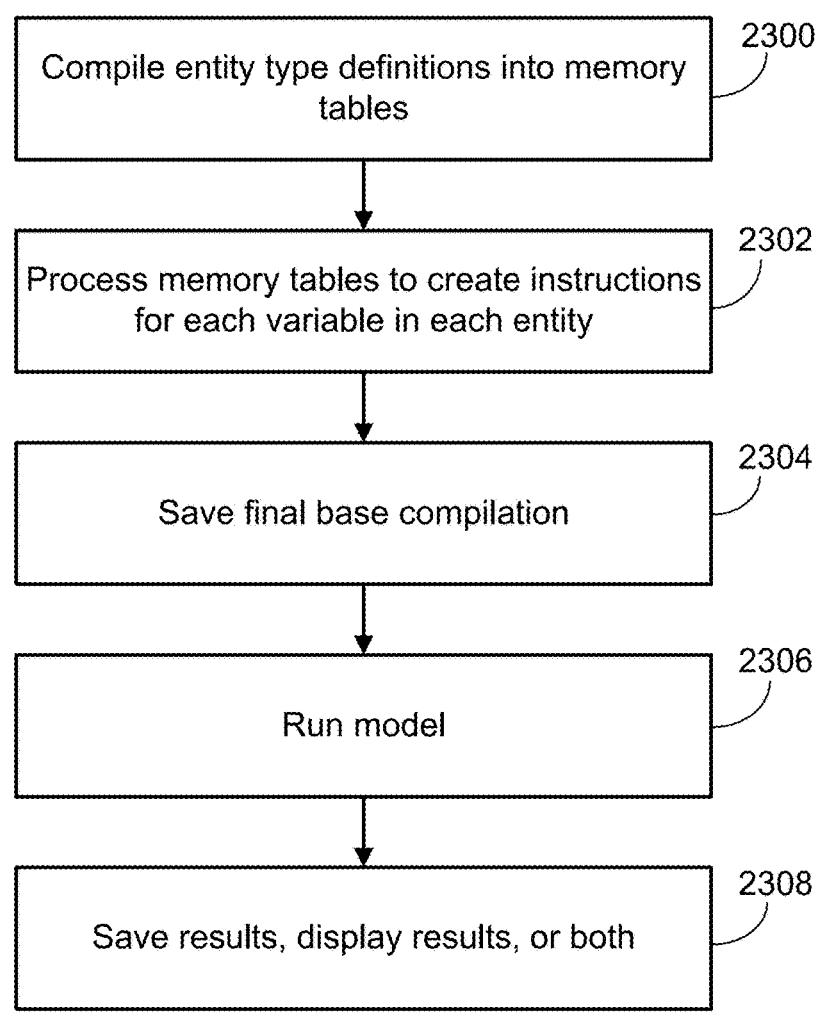
FIG. 23 is a flow chart.

Referring also to FIG. 23, there are multiple steps involved in running the model. Entity type definitions are compiled into memory tables 2208 that reduce equation text to pointers and indexes (2300). When entities are created, these tables are processed to create individual instructions for each variable in each entity (2302). These instructions can be fully resolved in order to reduce simulation time. A final base compilation 2210 may be saved ("checkpointed") and reused for multiple runs (2304).

The model is run (2306) using a simulator engine 2212. Results of the model run can be stored in a data structure 2214, such as a database, an XML file, or another type of data structure; can be displayed on a user interface (not shown), or both (2308). In some cases, e.g., for Monte Carlo or optimization simulations, it may be possible to run a model repeatedly using a single compilation, using data and parameters that change for each simulation. In some cases, there may be significant variation in the data input that is used for each scenario, in which cases a model run manager may establish checkpoints with partial data.

Model Compilation

In typical usage of the platform, instructions (e.g., equations) can be applied for hundreds or thousands (or more) of time periods per model run. Each model may have millions (or more) of individual values that may need to be calculated for each time period. Certain types of analysis may involve thousands (or more) of individual model runs. Each model run can involve looping through all the time periods covered by the simulation. Processing each time period can involve looping through all of the variables whose values are to be calculated during each time period.

In some implementations, high levels of performance can be achieved through use of a multi-stage compiler process that initially establishes a memory map for each entity type and then generates logical instructions for each equation contained in the entity type definition. These equations may contain references to other entities and to collections of entities. The logical instructions are reduced to integer values that are table offsets for various definitions and data structures.

Table 15 contains a summary of working information that is generated by the compiler. This information describes the contents of every entity for a specific entity type and can be used during model execution to assign working storage and to generate finalized instructions for each equation for every variable.

TABLE 15

| Structure | Item | Description |
|---|---|---|
| Attribute List | Attribute Name | The attribute list identifies the attributes |
|  | Index | that are associated with each entity of the type |
|  | Offset | Position of the attribute in storage allocated for attributes belonging to a specific entity. This numbering starts at 0. |
| Stock Variable List | Variable Name | The stock variable list identifies the stocks |
|  | Index | that are associated with each entity of the type |
|  | Offset | Position of the stock in storage allocated for stocks belonging to a specific entity. This numbering starts at 0. |

TABLE 15-continued

| Structure | Item | Description |
|---|---|---|
| Calculation Variable List | Variable Name Index | The list identifies the auxiliary and flow variables that are associated with each entity of the type |
| | Offset | Position of the variable in storage allocated for variables belonging to a specific entity. This numbering starts at 0. |
| | Instruction index | A pointer to the general instructions required to execute the equation for the specific calculation variable |
| Entity Reference List | Entity Type Name Index | The entity type that is being referenced |
| | Reference Name Index | An optional abbreviation for this entry |
| | Filter Instruction Pointer | A pointer to the logical instructions which are used to identify a specific referenced entity or a sub-collection or entities. |
| | Reference Offset | The offset of a resolved reference pointer in for the entity. Before simulation, each reference for the entity is fully resolved and saved to minimize processing. Numbering starts at 0. |
| Entity Summary | Attribute Count | Used to allocate space on the attribute stack for every entity created |
| | Stock Variable Count | Used to allocate space on the stock variable stack for every entity created |
| | Calculation Variable Count | Used to allocate space on the calculation variable stack for every entity created |
| | Entity Reference Count | Used to allocate space on the entity reference stack for every entity created |

Figure 24:
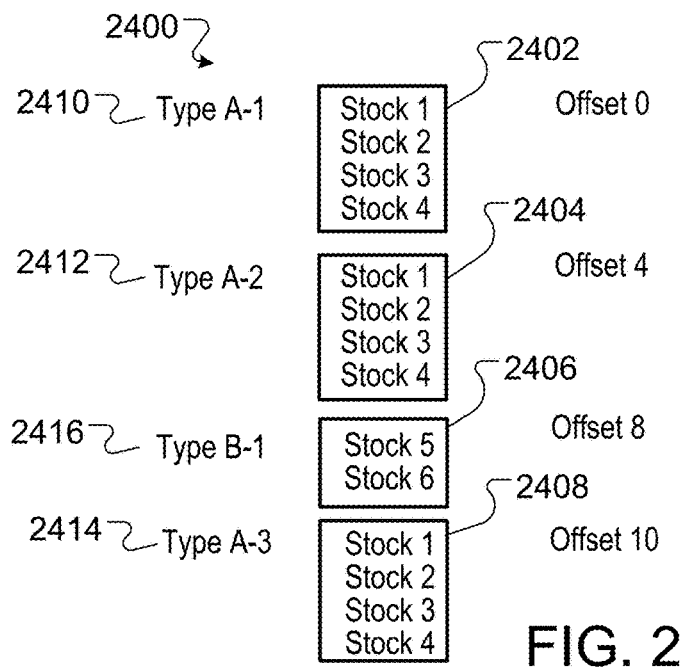
FIG. 24 is a diagram of a memory allocation scheme.

Referring to FIG. 24, in one example of a memory allocation scheme, memory can be allocated to entities on four memory stacks 2402, 2404, 2406, 2408. Three entities of Type A (entities 2410, 2412, 2414) and one entity of Type B (entity 2416). Type A entities each have 4 stock variables and the Type B entity has 2 stock variables. Assuming that Type A-1 2410 is the first entity in the stack and thus has an offset of 0, the offsets for the remaining entities on the memory stacks can be determined.

In one implementation, Table 16 can be used during model execution. One entry in the table is made for each specific entity that is created, including those loaded prior to the start of the simulation. The offsets for a specific entity can be combined with the detailed offsets in Table 15 to calculate the storage address for every variable used in equations.

TABLE 16

| Structure | Item | Description |
|---|---|---|
| Entity Table | Entity Type | Identifies type of entity |
| | Entity Name Index | Points the unique identifier for the entity |
| | Attribute Offset | Where attribute storage begins |
| | Stock Offset | Where stock storage for this entity begins |
| | Calculation Variable Offset | Where variable storage for this entity begins |
| | Reference Stack Offset | Where the reference pointers for this entity are stored |

The attribute, stock, and calculation variable stacks are used during model execution to store values according to a memory scheme, e.g., similar to the memory scheme 2400 shown in FIG. 24. The data structures described above support the generation of instructions that can be processed efficiently by the simulator.

Each equation can be compiled into a series of simple instructions that are interpreted by a simulation execution function. Typical instructions include, e.g., arithmetic operations which get and put information from and into the calculation stacks. To use a value, the simulation execution function determines which entity and which variable corresponds to the value and calculates the exact address by adding the corresponding offsets.

In one implementation, the simulation execution function can loop though all calculations and resolve the location of each value using the entity references, entity locations, and variable offsets. In some cases, this approach can use a significant percentage of the total run time just performing index arithmetic.

In one implementation, the simulation execution function can "flatten" the loop through the calculations and generate separate instructions for each entity-variable combination. These individual instructions can usually resolve equations into exact locations because the relationships between entities are usually static or change infrequently. The compiled instructions can take more space and can take more time to generate, but the execution is generally much faster than the looping approach. The savings accrue for each time period and may often extend across multiple simulation runs.

Model Execution

Prior to the start of model execution, one of more entities can be created by allocating variable locations in a results vector. Separate "finalized" instructions can then be written for every instance of each equation. These finalized instructions resolve all variable references with the exact offset into the results vector. This reduces or minimizes the amount of work to be performed during execution.

During model execution, additional entities may be created. As new entities are created, the results vector is extended and more finalized instructions are written. When entities are disabled, the allocated space in the results vector is simply not used. When instructions are dynamically modified during model execution, new "finalized" instructions are produced.

Additional optimizations that can reduce or minimize the amount of work to be performed during execution can include one or more of the following:

- Skipping calculations for variables that are not referenced or saved—especially for optimization, Monte Carlo simulation and other algorithms that involve iterative simulation.
- Skipping all processing for entities that are not active at a given time.
- Identifying expressions that are used in multiple equations in order to calculate values once and reuse many times.
- Automatic sequencing of calculations whose order and necessity can be determined at compile time.
- Inherent speedup to sparse matrix operations from the collection/attribute/relationship approach, which avoids the creation and calculation of empty attribute combinations.

When all of the variables and time periods are known before simulation begins, it is possible to pre-allocate all of the space for storing results. Memory re-allocation can be potentially expensive in terms of performance impact. Dynamic restructuring, the addition of new entities and their associated variables, or both, can cause reallocation and copying to occur during the simulation.

In one implementation, basic file storage can be organized by time slices with the necessary index tables to identify the information. Separate time slices can be maintained for stocks and for other variables. This separation can benefit simulation performance by enabling a bulk copy algorithm for the state variables.

Figure 25:
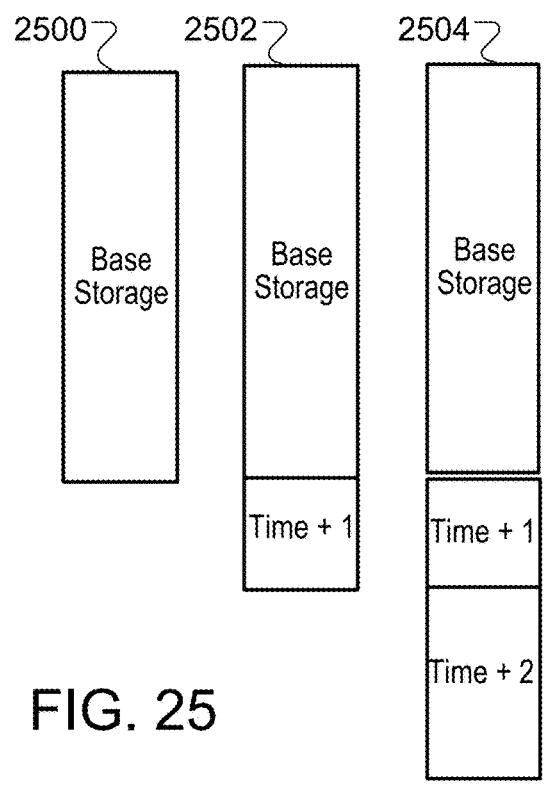
FIG. 25 is a diagram of file storage.

For instance, FIG. 25 illustrates how time slices may grow with time. The platform can use separate vectors for each time slice, e.g., vectors 2500, 2502, 2504 for three consecutive time slices. The position of entity information at time N+1 (vector 2502) is the same as that use for time N (vector 2500). Time Slice N+1 will be larger than Time Slice N if any new entities are created. New items are added to the end of each time slice. This approach maintains the validity of the finalized instruction sets. When entities are deleted during the course of a simulation, the space allocated to those entities is simply not used.

The simulation engine can maintain a collection of all time slices that allows for efficient retrieval of past information during simulation. The simulation engine can also support the generation of time series output for selected variable information. In some implementations, processing of output functions may be delayed until after simulation is complete and it is known that the information is required. For instance, during most simulation studies, most intermediate calculations are never referenced. The platform can allow for any values to be retrieved, but it will not perform this work until needed. This is especially important during optimization or sensitivity runs where many individual simulations are run but only a few variables need to be evaluated for each run.

Results Analysis

In some implementations, results of model runs can be initially stored in memory structures. The logical structure of the output can be entity—variable=time–value. The output can be stored as one vector per saved time period. A given entity-variable value can be stored at the same position in every time vector. Thus, it is possible to quickly loop through these memory structures and extract time series data for the variables. When desired, selected outputs variables can be placed in a table matrix with the variable identification and time as the axes. Model results may also be loaded into databases. In addition to variable values, the platform can also store and restore action (e.g., transaction) history for all or selected actions that occur during a simulation. These transaction log tables can contain some or all of the values used by the action and a timestamp to indicate when the action occurred. The transaction logs may also be loaded into databases if desired. Results can be connected with model run information that identifies model definition version, data input contents, special parameters that may have been applied, other information, or a combination of any two or more of these types of information.

The platform can provide many ways to view and analyze simulation results. Results may also be made available through file export and database updates which will make it easy to use analytic tools and business intelligence software.

Some example analysis tools provided with the platform may include:

Line Plots
Tabular Output
Bar Charts
Histograms for analyzing the distribution of entities The data may be any variable for any entity, collection aggregates or counts for any collection or sub-set of entities, or both.

The data may come from a single run, multiple run comparisons, or both.

The results displays may provide drill down analysis based on the model definitions.

Figure 26:
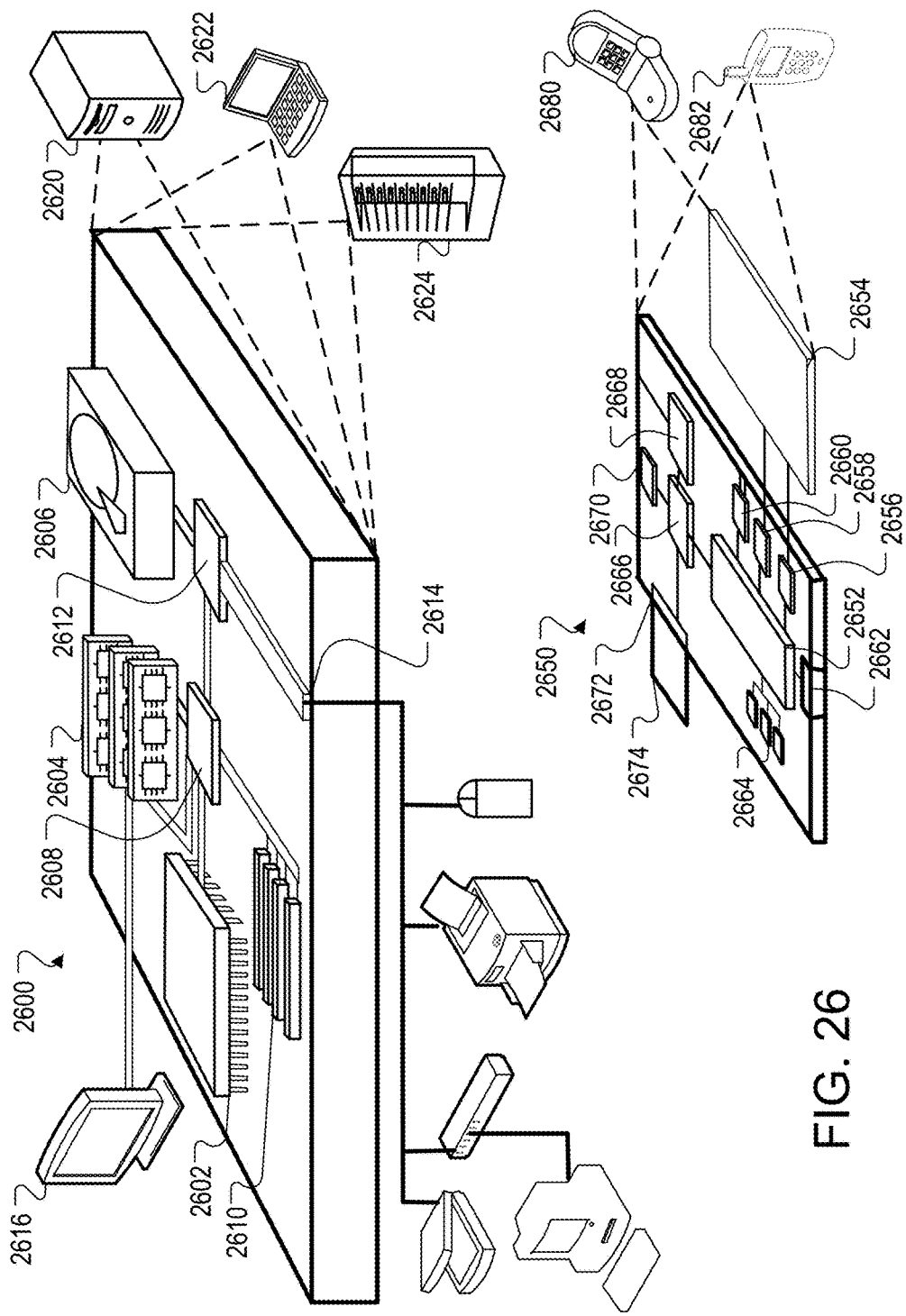
FIG. 26 is a diagram of a computing system.

FIG. 26 shows an example of a personal computing device 2600 and a mobile device 2650, which may be used with the techniques described here. For example, referring to FIG. 1, the computing devices 102a, 102b could be examples of the personal computing device 2600 or the mobile device 2650, and the media repository 108 could include one or more computer devices 2600. Computing device 2600 is intended to represent various forms of digital computers, such as laptops, desktops, workstations, personal digital assistants, servers, blade servers, mainframes, and other appropriate computers. Computing device 2650 is intended to represent various forms of mobile devices, such as personal digital assistants, cellular telephones, smartphones, and other similar computing devices. The components shown here, their connections and relationships, and their functions, are meant to be examples only, and are not meant to limit implementations of the techniques described and/or claimed in this document.

Computing device 2600 includes a processor 2602, memory 2604, a storage device 2606, a high-speed interface 2608 connecting to memory 2604 and high-speed expansion ports 2610, and a low speed interface 2612 connecting to low speed bus 2614 and storage device 2606. Each of the components 2602, 2604, 2606, 2608, 2610, and 2612, are interconnected using various busses, and may be mounted on a common motherboard or in other manners as appropriate. The processor 2602 can process instructions for execution within the computing device 2600, including instructions stored in the memory 2604 or on the storage device 2606 to display graphical information for a GUI on an external input/output device, such as display 2616 coupled to high speed interface 2608. In other implementations, multiple processors and/or multiple buses may be used, as appropriate, along with multiple memories and types of memory. Also, multiple computing devices 2600 may be connected, with each device providing portions of the necessary operations (e.g., as a server bank, a group of blade servers, or a multi-processor system).

The memory 2604 stores information within the computing device 2600. In one implementation, the memory 2604 is a volatile memory unit or units. In another implementation, the memory 2604 is a non-volatile memory unit or units. The memory 2604 may also be another form of computer-readable medium, such as a magnetic or optical disk.

The storage device 2606 is capable of providing mass storage for the computing device 2600. In one implementation, the storage device 2606 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 2604, the storage device 2606, memory on processor 2602, or a propagated signal.

The high speed controller 2608 manages bandwidth-intensive operations for the computing device 2600, while the low speed controller 2612 manages lower bandwidth-intensive operations. Such allocation of functions is an example only. In one implementation, the high-speed controller 2608 is coupled to memory 2604, display 2616 (e.g., through a graphics processor or accelerator), and to high-speed expansion ports 2610, which may accept various expansion cards (not shown). In the implementation, low-speed controller 2612 is coupled to storage device 2606 and low-speed expansion port 2614. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 2600 may be implemented in a number of different forms, as shown in the figure. For example, it may be implemented as a standard server 2620, or multiple times in a group of such servers. It may also be implemented as part of a rack server system 2624. In addition, it may be implemented in a personal computer such as a laptop computer 2622. Alternatively, components from computing device 2600 may be combined with other components in a mobile device (not shown), such as device 2650. Each of such devices may contain one or more of computing device 2600, 2650, and an entire system may be made up of multiple computing devices 2600, 2650 communicating with each other.

Computing device 2650 includes a processor 2652, memory 2664, an input/output device such as a display 2654, a communication interface 2666, and a transceiver 2668, among other components. The device 2650 may also be provided with a storage device, such as a microdrive or other device, to provide additional storage. Each of the components 2650, 2652, 2664, 2654, 2666, and 2668, are interconnected using various buses, and several of the components may be mounted on a common motherboard or in other manners as appropriate.

The processor 2652 can execute instructions within the computing device 2650, including instructions stored in the memory 2664. The processor may be implemented as a chipset of chips that include separate and multiple analog and digital processors. The processor may provide, for example, for coordination of the other components of the device 2650, such as control of user interfaces, applications run by device 2650, and wireless communication by device 2650.

Processor 2652 may communicate with a user through control interface 2658 and display interface 2656 coupled to a display 2654. The display 2654 may be, for example, a TFT LCD (Thin-Film-Transistor Liquid Crystal Display) or an OLED (Organic Light Emitting Diode) display, or other appropriate display technology. The display interface 2656 may comprise appropriate circuitry for driving the display 2654 to present graphical and other information to a user. The control interface 2658 may receive commands from a user and convert them for submission to the processor 2652. In addition, an external interface 2662 may be provide in communication with processor 2652, so as to enable near area communication of device 2650 with other devices. External interface 2662 may provide, for example, for wired communication in some implementations, or for wireless communication in other implementations, and multiple interfaces may also be used.

The memory 2664 stores information within the computing device 2650. The memory 2664 can be implemented as one or more of a computer-readable medium or media, a volatile memory unit or units, or a non-volatile memory unit or units. Expansion memory 2674 may also be provided and connected to device 2650 through expansion interface 2672, which may include, for example, a SIMM (Single In Line Memory Module) card interface. Such expansion memory 2674 may provide extra storage space for device 2650, or may also store applications or other information for device 2650. Specifically, expansion memory 2674 may include instructions to carry out or supplement the processes described above, and may include secure information also. Thus, for example, expansion memory 2674 may be provide as a security module for device 2650, and may be programmed with instructions that permit secure use of device 2650. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 2664, expansion memory 2674, memory on processor 2652, or a propagated signal that may be received, for example, over transceiver 2668 or external interface 2662.

Device 2650 may communicate wirelessly through communication interface 2666, which may include digital signal processing circuitry where necessary. Communication interface 2666 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 2668. In addition, short-range communication may occur, such as using a Bluetooth, WiFi, or other such transceiver (not shown). In addition, GPS (Global Positioning System) receiver module 2670 may provide additional navigation- and location-related wireless data to device 2650, which may be used as appropriate by applications running on device 2650.

Device 2650 may also communicate audibly using audio codec 2660, which may receive spoken information from a user and convert it to usable digital information. Audio codec 2660 may likewise generate audible sound for a user, such as through a speaker, e.g., in a handset of device 2650. Such sound may include sound from voice telephone calls, may include recorded sound (e.g., voice messages, music files, and so forth) and may also include sound generated by applications operating on device 2650.

The computing device 2650 may be implemented in a number of different forms, as shown in the figure. For example, it may be implemented as a cellular telephone 2680. It may also be implemented as part of a smartphone 2682, personal digital assistant, tablet computer, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well. For example, feedback provided to the user can be any form of sensory feedback (e.g., visual feedback, auditory feedback, or tactile feedback). Input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

Other implementations are also within the scope of the following claims.

What is claimed is:

1. A method comprising
    by a computer, based on information received from a user through a graphical user interface, forming definitions that together define a model that can be run by a computer to simulate operation of a system, one or more software entities being creatable according to each definition, each of the definitions representing a corresponding type of feature of the system, the forming including:
        associating one or more attributes, one or more variables, and one or more relationship identifiers with each of the definitions, at least one of the variables being associated with an equation, in which an attribute is assignable a value uniquely identifying a second software entity upon creation of a first software entity according to a definition; and
        compiling the definitions, including, for each definition, expressing each equation of the definition as a reference to a location, in a memory map for the definition, for each of the variables associated with the equation;
    by a computer, creating one or more software entities according to each definition, each software entity including the one or more attributes, the one or more variables, and the one or more relationship identifiers associated with the corresponding definition, each software entity representing a feature of the corresponding type, in which creating a particular software entity according to a particular definition includes:
        assigning an initial attribute value to the particular software entity for each attribute associated with the particular definition, the assigning including (i) assigning a first attribute value for a first attribute of the particular software entity, the first attribute value uniquely identifying a first software entity created according to the particular definition, the first software entity being different from the particular software entity to which the first attribute value is assigned, and (ii) assigning a second attribute value for a second attribute of the particular software entity, the second attribute value uniquely identifying a second software entity created according to another definition different from the particular definition;
        assigning an initial variable value to the particular software entity for each variable associated with the particular definition; and
        compiling the particular software entity, including determining a location in memory for each variable according to the memory map for the definition and expressing each equation of the particular definition as a reference to the location in memory for each of the variables associated with the equation; and
        a relationship between the particular software entity and a related software entity created according to another definition different from the particular definition being indicated by one of the relationship identifiers associated with the particular definition, the relationship being implemented based on a mapping of corresponding attribute values, the mapping of corresponding attribute values indicative of a correspondence between respective attribute values of an attribute of the particular software entity and corresponding attribute values of a corresponding attribute of the related software entity; and by a computer, running the compiled model using the compiled software entities, including, for each software entity:

determining attribute values for each attribute of the software entity and variable values for each variable of the software entity over time according to (i) the initial attribute values, (ii) the initial variable values, (iii) the equations of the software entity, and (iv) the attribute values and variable values for one or more other software entities related to the software entity through one of the relationship identifiers, relationships among software entities being changeable during running of the model, wherein a changed relationship between a first software entity and a second software entity is indicated by a change in an attribute value for an attribute of the first software entity that results in a change in the relationship according to the mapping of corresponding attribute values.

2. The method of claim 1 in which running the model includes running the model in a mode that combines continuous-time simulation and discrete event simulation.

3. The method of claim 2 in which the mode of running the model also includes the use of software agents.

4. The method of claim 1 in which the model is expressed in a declarative, non-procedural language.

5. The method of claim 1 comprising changing the software entities dynamically during the running of the model.

6. The method of claim 1 in which at least some of the software entities that form the model can be copied and reused in defining other models.

7. The method of claim 1 in which the model includes software entities that serve as relationship lists.

8. The method of claim 1 in which at least one of the equations represents stocks and flows.

9. The method of claim 8 in which at least some of the stocks, at least some of the flows, or both, include respective qualities.

10. The method of claim 9 in which each quality is represented by an equation determined from the equation that represents the corresponding stock or the corresponding flow.

11. The method of claim 8 in which at least one of the software entities includes a plurality of alternative equations for the software entity.

12. The method of claim 11 in which the alternative equations for a particular software entity are conditional upon one or more attributes of the particular software entity.

13. The method of claim 1 in which the definitions that define the model are stored based on information received from multiple cooperating users who are working concurrently on a given aspect of the model or are working concurrently on different aspects of the model, or both.

14. The method of claim 1 in which each equation is generated automatically from graphical representations that are manipulated by the users through the graphical user interface.

15. The method of claim 1 including checking the variables associated with each of the equations for dimensional consistency.

16. The method of claim 1 in which the information received from the user is other than programming code.

17. The method of claim 1 comprising exposing to the user the graphical user interface to enable the user to interactively and graphically cause the definitions of the model to be formed and stored.

18. The method of claim 1 comprising running a portion of the model using only a portion of the software entities.

19. The method of claim 1 in which the running of the model includes enabling the user to interact with the definitions or software entities of the model while the model is running, and the running of the model changes to reflect the user's interaction.

20. The method of claim 1 comprising exposing a data interface through which data to be used by the model and data generated by the model can be passed back and forth to systems that maintain data according to common protocols.

21. The method of claim 1 comprising processing data received from a data source according to the model.

22. The method of claim 21 in which processing data includes adjusting a temporal property of the data, interpolating the data, extrapolating the data, converting units associated with the data, aggregating the data, allocating the data into categories, or a combination of any two or more of them.

23. The method of claim 1 in which the software entities created according to a given definition are grouped into a collection for common processing.

24. The method of claim 23 in which at least some of the collections of entities represent multidimensional data without the use of subscripts.

25. The method of claim 1 in which software entities sharing one or more common attributes are automatically grouped into a collection.

26. The method of claim 1 in which software entities sharing one or more common attributes and one or more common variables are automatically grouped into a collection.

27. The method of claim 1 in which software entities created according to multiple definitions that are based on a common parent definition are automatically grouped into a super-collection.

28. The method of claim 1 comprising exposing through the user interface graphical representations of the definitions and relationships among them.

29. The method of claim 28 comprising enabling the user to interact with the representations and adjusting the model in accordance with the user's interactions.

30. The method of claim 1 in which running of the model includes creating and eliminating instantiations of software entities.

31. The method of claim 1 in which each of the definitions comprises properties that model a state of the software entities that are created according to the definition.

32. The method of claim 1 in which each of the definitions comprises rules and equations that determine a change in the state of the software entities that are created according to the definition during the running of the model.

33. The method of claim 1 in which at least one of the definitions is defined based on one or more other definitions.

34. The method of claim 1 in which one or more of the definitions are defined by the user through the graphical user interface.

35. The method of claim 34 in which two or more users collaborate concurrently in defining the definitions.

36. The method of claim 34 in which the graphical user interface provides a diagrammatic interface including a toolbar and a workspace.

37. The method of claim 1 in which some of the software entities comprise relationship entities that define relationships among other software entities.

38. The method of claim 37 in which relationship entities include internal states of software entities and dynamic behavior of software entities.

39. The method of claim 1 in which the model includes action components that provide discrete event and agent-based capabilities in the context of a continuous dynamic model.

40. The method of claim 39 in which one or more of the action components include schedule properties indicative of when the action component is to be executed.

41. The method of claim 39 in which one or more of the action components include condition properties indicative of a condition upon which the action is to be executed.

42. The method of claim 39 in which one or more of the action components cause changes of state of a plurality of software entities to occur at substantially the same time.

43. The method of claim 1 in which at least some of the software entities are created during the initialization or running of the model, and the creation of software entities is governed by probabilistic functions based on statistical distributions.

44. The method of claim 43 in which the statistical distributions are derived from behavior of existing software entities during the running of the model.

45. The method of claim 1 in which the model is organized in modules, and comprising maintaining the modules, in which each module can be maintained by a different user.

46. The method of claim 1 comprising defining the definitions without requiring them to include information or structure that is specific to a problem, system, or situation, and initializing the model using data from external sources.

47. The method of claim 1 in which each of the software entities comprises attributes, states and equations that define its dynamic behavior.

48. The method of claim 1, in which each attribute value comprises a string.

49. The method of claim 48, in which each attribute value exists as a key identifier in a base entity.

50. The method of claim 1, in which a relationship between software entities is implemented by mapping one or more attributes associated with a first entity to corresponding attributes associated with a second entity.

51. The method of claim 50, in which each attribute value exists as a key identifier in a base entity and in which the relationship between software entities is determined using the key identifiers.

52. The method of claim 1, comprising creating a collection of software entities that share one or more of (i) a common definition, (ii) a common attribute value, or (iii) a common relationship.

53. The method of claim 1, comprising creating a new software entity or deleting an existing software entity based on the determined state of each software entity.

54. The method of claim 1, in which the variable values and the attribute values assigned to each software entity together are indicative of a state of the feature of the system represented by the software entity.

55. The method of claim 1, in which a software entity created according to a particular definition is identifiable, categorizable, or logically differentiable by an attribute value for a second attribute that uniquely identifies a software entity created according to a different definition.

56. A method comprising
  by a computer, running a compiled model that includes software entities in a mode that combines continuous-time simulation and discrete-event simulation,
  each of the software entities comprising an instantiation of a corresponding definition that corresponds to a feature of a system that is a subject of the model, each definition including:
    one or more attributes, in which when one or more software entities are instantiated according to the definition, each instantiated software entity is assigned an initial attribute value for each attribute, an initial attribute value for a first attribute of the instantiated software entity uniquely identifying a first software entity other than the instantiated software entity, the first software entity being instantiated according to the definition and an initial attribute value for a second attribute of the instantiated software entity uniquely identifying a second software entity other than the instantiated software entity, the second software entity being instantiated according to another definition different from the definition,
    one or more variables, at least one of the variables associated with an equation, and
    one or more relationship identifiers, each relationship identifier indicative of a relationship between a software entity instantiated according to the definition and a related software entity instantiated according to another definition different from the definition, the relationship being implemented based on a mapping of corresponding attribute values, the mapping of corresponding attribute values indicative of a correspondence between respective attribute values of an attribute of the software entity and corresponding attribute values of a corresponding attribute of the related software entity,
    relationships among software entities being changeable during execution of the model, wherein a changed relationship between a first software entity and a second software entity is indicated by a change in an attribute value for an attribute of the first software entity that results in a change in the relationship according to the mapping of corresponding attribute values
  the compiling of the model including:
    compiling the definitions, including, for each definition, expressing each equation of the definition as a reference to a location, in a memory map for the definition, for each of the variables associated with the equation, and
    compiling the software entities, each software entity including the one or more attributes, the one or more variables, and the one or more relationship identifiers associated with the corresponding definition, the compiling including, for each software entity, determining a location in memory for each variable according to the memory map and expressing each equation of the corresponding definition as a reference to the location in memory for each of the variables associated with the equation,
  each of the definitions comprising a discrete stand-alone software unit that is reusable with other definitions in other models.

57. A computer-implemented simulation platform comprising
a processor coupled to a memory, the processor and the memory together configured to:
store a specification of a model of a system, the specification of the model defined by definitions, each definition representing a corresponding type of feature of the system, each definition being associated with one or more attributes, one or more variables, and one or more relationship identifiers, at least one of the variables being associated with an equation, an attribute being assignable a value uniquely identifying a second software entity upon creation of a first software entity according to a definition;
compile the model of the system, including, for each definition, expressing each equation of the definition as a reference to a location, in a memory map for the definition, for each of the variables associated with the equation;
execute the compiled model to simulate the system, including:
creating one or more software entities according to each definition, each software entity including the one or more attributes, the one or more variables, and the one or more relationship identifiers associated with the corresponding definition, each software entity representing a feature of the corresponding type, creating a particular software entity according to a particular definition including:
assigning an initial attribute value to the particular created software entity for each attribute associated with the particular definition and assigning a memory location for each initial attribute value for the particular software entity according to the memory map for the particular definition, the assigning including (i) assigning a first attribute value for a first attribute of the particular software entity, the first attribute value uniquely identifying a first software entity created according to the particular definition, the first software entity being different from the particular software entity to which the first attribute value is assigned, and (ii) assigning a second attribute value for a second attribute of the particular software entity, the second attribute uniquely identifying a second software entity created according to another definition different from the particular definition;
assigning an initial variable value to the particular software entity for each variable associated with the particular definition and assigning a memory location for each initial variable value for the particular software entity according to the memory map for the particular definition, and
compiling the particular software entity, including determining a location in memory for each variable according to the memory map for the particular definition and expressing each equation of the definition as a reference to the location in memory for each of the variables associated with the equation; and
a relationship between the particular software entity and a related software entity created according to another definition different from the particular definition being indicated by one of the relationship identifiers associated with the particular definition, the relationship being implemented based on a mapping of corresponding attribute values, the mapping of corresponding attribute values indicative of a correspondence between respective attribute values of attribute of the particular software entity and corresponding attribute values of a corresponding attribute of the related software entity; and
for each software entity, determining attribute values for each attribute of the software entity and variable values for each variable of the software entity over time according to (i) the initial attribute values, (ii) the initial variable values, (iii) the equations of the software entity, and (iv) the attribute values and variable values for one or more other software entities related to the software entity through one of the relationship identifiers,
relationships among software entities being changeable during running of the model, wherein a changed relationship between a first software entity and a second software entity is indicated by a change in an attribute value for an attribute of the first software entity that results in a change in the relationship according to the mapping of corresponding attribute values.

58. The simulation platform of claim 57 in which the processor and memory are configured to determine continuous changes in one or more of the software entities.

59. The simulation platform of claim 57 in which the processor and memory are configured to determine a state of the system at a particular time.

60. The simulation platform of claim 57 in which the processor and memory are distributed over a plurality of computing systems.

61. The simulation platform of claim 57 in which the processor and memory are configured to store the results of the model execution in a data structure.

62. The simulation platform of claim 57 in which the processor and memory are configured to display the results of the model execution on a user interface.

63. The simulation platform of claim 57 in which each software entity includes variables, attributes, data, actions, or a combination of any two or more of them.

64. The simulation platform of claim 63 in which the plurality of software entities are organized into one or more collections based on one or more attributes of the software entities.

65. The simulation platform of claim 63 in which at least some of the plurality of software entities are organized into one or more collections based on one or more attributes of the entities and one or more variables of the entities.

66. The simulation platform of claim 57, in which the processor and memory are configured to store a plurality of definitions of the model, the plurality of definitions corresponding to versions of the model.

67. The simulation platform of claim 66, in which the processor and memory are configured to store results of the execution of one or more of the versions of the model in a data structure.

68. A computer-implemented method comprising
by a computer, defining a model of a system, including
specifying one or more definitions, one or more software entities creatable according to each definition, each definition including:
one or more attributes, in which for each software entity created according to the definition, the software entity is assigned an initial attribute value for each attribute, the assigning including (i) assigning a first attribute value for a first attribute of the software entity, the first attribute value uniquely identifying a first software entity created according to the definition, the first software entity being different from the particular software entity to which the first attribute is assigned, and (ii) assigning a second attribute value for a second attribute of the software entity, the second attribute value uniquely identifying a second software entity created according to another definition different from the definition, and one or more variables, at least one of the variables associated with an equation, compiling the model of the system, including, for each definition, expressing each equation of the definition as a reference to a location, in a memory map for the definition, for each of the variables associated with the equation, creating one or more software entities according to each definition, each software entity including the one or more attributes, the one or more variables, and the one or more relationship identifiers associated with the corresponding definition, each software entity representing a component of the system, including, for each software entity created according to a particular definition, determining a location in memory for each variable of the software entity according to the memory map for the particular definition and expressing each equation of the particular definition as a reference to the location in memory for each of the variables associated with the equation, and specifying relationships among the one or more software entities according to one or more of the attributes associated with each of the software entities, a relationship between a particular software entity and a related software entity being implemented based on a mapping of corresponding attribute values, the mapping of corresponding attribute values indicative of a correspondence between respective attribute values of an attribute of the particular software entity and corresponding attribute values of a corresponding attribute of the related software entity, and by a computer, executing the compiled model, including determining changes in one or more of the software entities over time, relationships among software entities being changeable during execution of the model, wherein a changed relationship between a first software entity and a second software entity is indicated by a change in an attribute value for an attribute of the first software entity that results in a change in the relationship according to the mapping of corresponding attribute values.

69. The computer-implemented method of claim 68, in which executing the model includes creating a new software entity in the model during execution of the model, removing a software entity from the model during execution of the model, or both.

70. The computer-implemented method of claim 69, in which creating a new software entity in the model includes splitting a pre-existing software entity into two or more software entities.

71. The computer-implemented method of claim 69, in which removing a software entity from the model includes merging two or more pre-existing software entities into a single software entity.

72. The computer-implemented method of claim 68, in which executing the model includes determining continuous changes, discrete changes, or both, over time in one or more of the software entities.

73. The computer-implemented method of claim 68, in which specifying a definition includes specifying properties for software entities created according to the definition.

74. The computer-implemented method of claim 68, in which specifying a definition includes specifying the definition based on one or more other definitions.

75. The computer-implemented method of claim 68, in which defining the model includes defining the model using a graphical user interface.

76. The computer-implemented method of claim 68, in which defining the model includes generating a graphical representation of the model.

77. A method comprising
by a computer, defining a model that can be run by a computer to simulate operation of a system that includes features, including
defining one or more definitions, including defining at least one definition based on one or more previously defined definitions, one or more software entities creatable according to each definition, the defining including, for each definition:
associating one or more attributes with the definition, in which for each software entity created according to the definition, the software entity is assigned an initial attribute value for each attribute, the assigning including (i) assigning a first attribute value for a first attribute of the software entity, the first attribute value uniquely identifying a first software entity created according to the definition, the first software entity being different from the particular software entity to which the first attribute value is assigned, and (ii) assigning a second attribute value for a second attribute of the software entity, the second attribute value uniquely identifying a software entity created according to another definition different from the definition,
associating one or more variables with the definition, at least one of the variables associated with an equation, and
associating one or more relationship identifiers with the definition, each relationship identifier indicative of a relationship between a software entity created according to the definition and a related software entity created according to another definition different from the definition, the relationship being implemented based on a mapping of corresponding attribute values, the mapping of corresponding attribute values indicative of a correspondence between respective attribute values of an attribute of each of the software entities, and
compiling the model, including, for each definition, expressing each equation of the definition as a reference to a location, in a memory map for the definition, for each of the variables associated with the equation,
creating one or more software entities according to each definition, each software entity including the one or more attributes, the one or more variables, and the one or more relationship identifiers associated with the corresponding definition, each entity corresponding to a feature of the system, including, for each software entity created according to a particular definition, determining a location in memory for each variable of the software entity according to the memory map for the particular definition and expressing each equation of the particular definition as a reference to the location in memory for each of the variables associated with the equation, and by a computer, executing the model, including determining changes in one or more of the software entities over time, relationships among software entities being changeable during execution of the model, wherein a changed relationship between a first software entity and a second software entity is indicated by a change in an attribute value for an attribute of the first software entity that results in a change in the relationship according to the mapping of corresponding attribute values.

* * * * *

UNITED STATES PATENT AND TRADEMARK OFFICE
CERTIFICATE OF CORRECTION

PATENT NO. : 10,275,545 B2
APPLICATION NO. : 13/837732
DATED : April 30, 2019
INVENTOR(S) : Larry F. Yeager et al.

It is certified that error appears in the above-identified patent and that said Letters Patent is hereby corrected as shown below:

In the Claims

Column 50, Line 48, Claim 56, after "values" insert -- , --

Signed and Sealed this
Twenty-fifth Day of June, 2019

Andrei Iancu
*Director of the United States Patent and Trademark Office*